(12) United States Patent
Yamazaki et al.

(10) Patent No.: US 7,981,766 B2
(45) Date of Patent: *Jul. 19, 2011

(54) MANUFACTURING METHOD AND MANUFACTURING APPARATUS OF SEMICONDUCTOR

(75) Inventors: Shunpei Yamazaki, Setagaya (JP); Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 62 days.

This patent is subject to a terminal disclaimer.

(21) Appl. No.: 12/222,546

(22) Filed: Aug. 12, 2008

(65) Prior Publication Data

US 2009/0047771 A1 Feb. 19, 2009

(30) Foreign Application Priority Data

Aug. 17, 2007 (JP) ................................ 2007-212679

(51) Int. Cl.
*H01L 21/30* (2006.01)
*H01L 21/46* (2006.01)

(52) U.S. Cl. ........ 438/458; 438/455; 438/456; 438/457; 438/459

(58) Field of Classification Search ........... 438/455–459
See application file for complete search history.

(56) References Cited

U.S. PATENT DOCUMENTS

| 6,380,046 | B1 | 4/2002 | Yamazaki |
| 6,770,515 | B1 | 8/2004 | Makita et al. |
| 6,821,826 | B1 | 11/2004 | Chan et al. |
| 7,052,974 | B2 | 5/2006 | Mitani et al. |
| 7,199,024 | B2 | 4/2007 | Yamazaki |
| 7,298,009 | B2 | 11/2007 | Yan et al. |
| 7,312,487 | B2 | 12/2007 | Alam et al. |
| 7,332,384 | B2 | 2/2008 | Buchholtz et al. |
| 2002/0146893 | A1* | 10/2002 | Shimoda et al. ............... 438/458 |
| 2003/0049915 | A1* | 3/2003 | Abe et al. ...................... 438/455 |
| 2004/0082149 | A1* | 4/2004 | Sakaguchi et al. ............ 438/458 |
| 2005/0280041 | A1* | 12/2005 | Hashimoto et al. ........... 257/213 |
| 2006/0019463 | A1* | 1/2006 | Jeong et al. ................... 438/455 |
| 2006/0043484 | A1 | 3/2006 | Cabral, Jr. et al. |
| 2007/0134891 | A1* | 6/2007 | Adetutu et al. ............... 438/464 |
| 2008/0182385 | A1* | 7/2008 | Kamine ........................ 438/458 |
| 2008/0283958 | A1 | 11/2008 | Ohnuma |
| 2008/0311725 | A1* | 12/2008 | Di Cioccio et al. ........... 438/455 |
| 2009/0053876 | A1 | 2/2009 | Yamazaki |

FOREIGN PATENT DOCUMENTS

| JP | 05-090117 | | 4/1993 |
| JP | 07-297377 | | 11/1995 |
| JP | 2000-012864 | | 1/2000 |
| JP | 2005-039171 | | 2/2005 |
| WO | WO2007/006914 | * | 1/2007 |

* cited by examiner

*Primary Examiner* — Andy Huynh
*Assistant Examiner* — Karen M Kusumakar
(74) *Attorney, Agent, or Firm* — Eric J. Robinson; Robinson Intellectual Property Law Office, P.C.

(57) ABSTRACT

To provide a manufacturing method of a semiconductor device using an SOI substrate, by which mobility can be improved. A plurality of semiconductor films formed using a plurality of bond substrates (semiconductor substrates) are bonded to one base substrate (support substrate). At least one of the plurality of bond substrates has a crystal plane orientation different from that of the other bond substrates. Accordingly, at least one of the plurality of semiconductor films formed over one base substrate has a crystal plane orientation different from that of the other semiconductor films. The crystal plane orientation of the semiconductor film is determined in accordance with the polarity of a semiconductor element formed using the semiconductor film. For example, an n-channel element in which electrons are majority carriers is formed using a semiconductor film having a face {100}, and a p-channel element in which holes are majority carriers is formed using a semiconductor film having a face {110}.

27 Claims, 20 Drawing Sheets

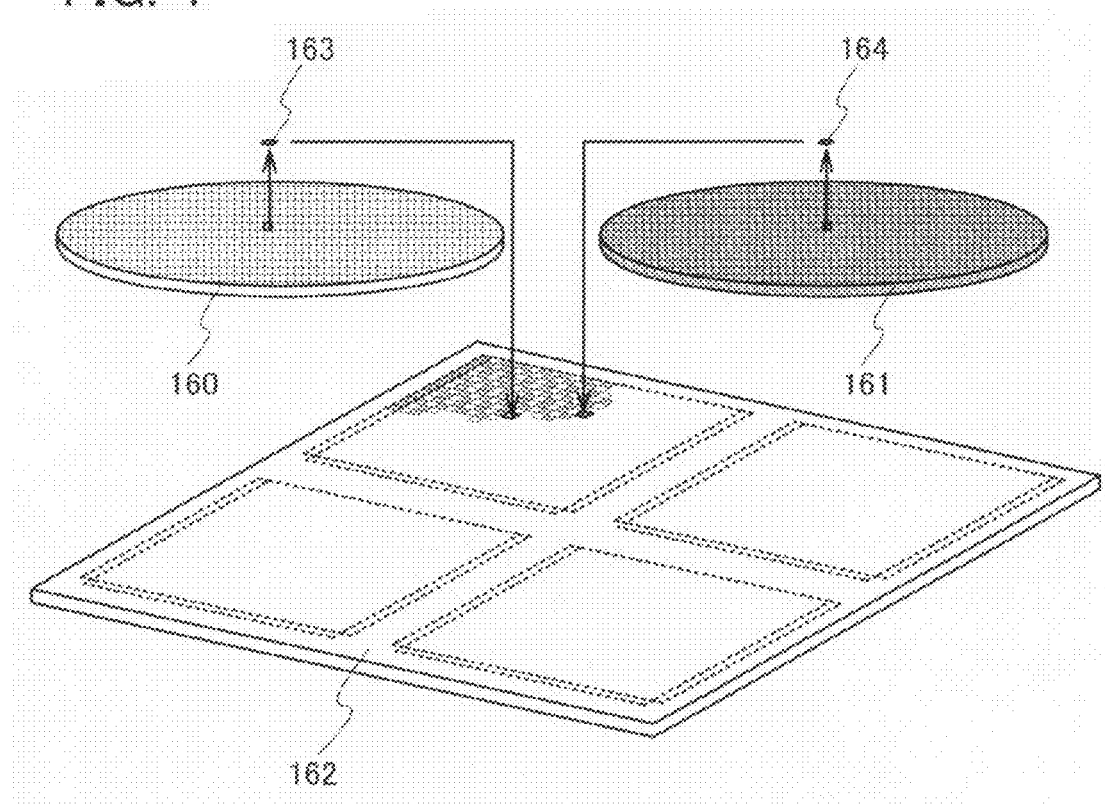

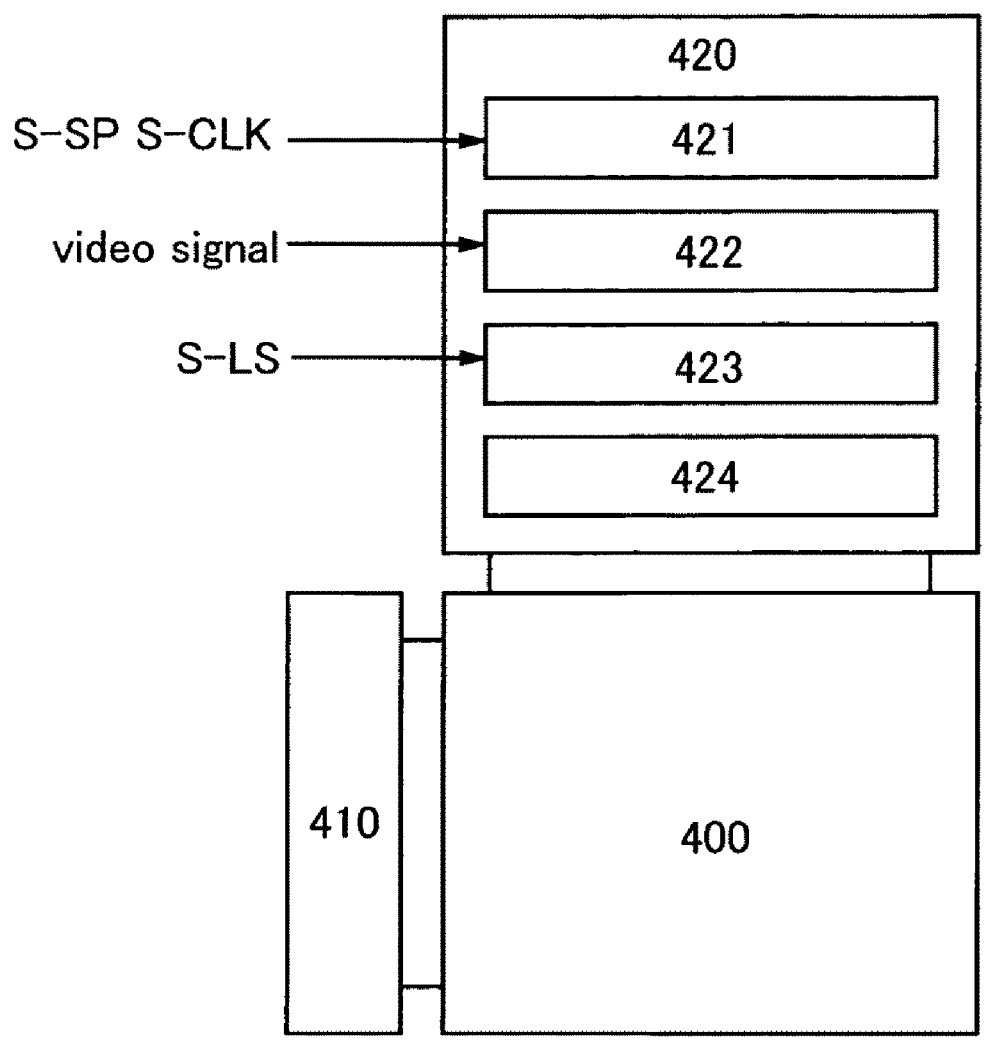

MANUFACTURING METHOD AND MANUFACTURING APPARATUS OF SEMICONDUCTOR

BACKGROUND OF THE PRESENT INVENTION

1. Field of the Present Invention

The present invention relates to a manufacturing method of a semiconductor device using an SOI (silicon on insulator) substrate, and a manufacturing apparatus using the manufacturing method. In particular, the present invention relates to a bonding SOI technique, and a manufacturing method of a semiconductor device and a manufacturing apparatus thereof, which use an SOI substrate obtained by bonding single crystal or polycrystalline semiconductor films to a substrate having an insulating surface.

2. Description of the Related Art

Demands for higher integration, higher speed operation, higher performance, and lower power consumption of a semiconductor integrated circuit have been significantly increasing. In order to satisfy these demands, a transistor using an SOI substrate has attracted attention as an effective alternative to a bulk transistor. In a transistor using an SOI substrate, a semiconductor film is formed over an insulating film; therefore, parasitic capacitance is reduced and leakage current can be prevented from flowing through a substrate. Accordingly, the transistor using an SOI substrate can be expected to achieve higher speed operation and lower power consumption as compared to a bulk transistor. The transistor using an SOI substrate has another advantage in that a semiconductor film used as an active layer can be reduced in thickness; thus, a short-channel effect can be suppressed, resulting in miniaturization of elements and therefore higher integration of a semiconductor integrated circuit.

One of the manufacturing methods of an SOI substrate is a method of bonding a semiconductor film to a substrate with an insulating film interposed therebetween, such as UNIBOND typified by Smart Cut, ELTRAN (epitaxial layer transfer), a dielectric separation method, and PACE (plasma assisted chemical etching). These bonding methods make it possible to form a high-performance integrated circuit using a single crystal semiconductor film over an inexpensive glass substrate.

One of the semiconductor devices using an SOI substrate is disclosed by Reference 1 (Reference 1: Japanese Published Patent Application No. 2000-012864).

SUMMARY OF THE INVENTION

The crystal orientation of a semiconductor film plays an important role in further increasing the mobility of a semiconductor element using an SOI substrate. However, in a p-type semiconductor, holes that are majority carriers have the highest mobility on the {110} crystal orientation, whereas in an n-type semiconductor, electrons that are majority carriers have the highest mobility on the {100} crystal orientation; that is, the mobility is improved on different crystal orientations. Accordingly, in the case of manufacturing an integrated circuit using a CMOS, it is difficult to further increase the mobility of a semiconductor element formed using an SOI substrate if a semiconductor film having a single crystal orientation is used.

Glass substrates used for manufacturing semiconductor devices such as flat panel displays have been increasing in size every year as in the seventh generation (1900 mm×2200 mm) and the eighth generation (2160 mm×2460 mm). From now on, it is predicted that glass substrates will further increase in size for the ninth generation (2400 mm×2800 mm, 2450 mm×3050 mm) and the tenth generation (2950 mm×3400 mm). Meanwhile, typical silicon substrates as one kind of semiconductor substrates have a diameter of 5 inches (125 mm), 6 inches (150 mm), 8 inches (200 mm), and 12 inches (300 mm), which are much smaller in size than glass substrates. Accordingly, if an SOI substrate is manufactured by bonding semiconductor substrates to a glass substrate, the number of the semiconductor substrates necessary for manufacturing the SOI substrate cannot be reduced when the glass substrate increases in size, which makes it difficult to reduce production cost.

In view of the foregoing problems, it is an object of the present invention to provide a manufacturing method of a semiconductor device using an SOI substrate, by which mobility can be improved.

In view of the foregoing problems, it is another object of the present invention to provide a manufacturing apparatus using the manufacturing method of the semiconductor device.

In order to solve the above-described problems, according to one feature of a manufacturing method of a semiconductor device of the present invention, a plurality of semiconductor films formed using a plurality of bond substrates (semiconductor substrates) are bonded to one base substrate (support substrate). Further, at least one of the plurality of bond substrates has a crystal plane orientation different from that of the other bond substrates. Accordingly, at least one of the plurality of semiconductor films formed over one base substrate has a crystal plane orientation different from that of the other semiconductor films. Then, the polarity of a semiconductor element formed using the semiconductor film is determined in accordance with the crystal plane orientation of the semiconductor film. For example, an n-channel element in which majority carriers are electrons is formed using a semiconductor film having a face {100}, and a p-channel element in which majority carriers are holes is formed using a semiconductor film having a face {110}.

Note that all of a plurality of semiconductor elements formed using semiconductor films having a face {100} are not necessarily of an n-channel type. It is acceptable as long as at least one of the plurality of semiconductor elements formed using semiconductor films having a face {100} is of an n-channel type. The plurality of semiconductor elements more preferably include more n-channel elements than p-channel elements. Further, all of a plurality of semiconductor elements formed using semiconductor films having a face {110} are not necessarily of a p-channel type. It is acceptable as long as at least one of the plurality of semiconductor elements formed using semiconductor films having a face {110} is of a p-channel type. The plurality of semiconductor elements more preferably include more p-channel elements than n-channel elements.

According to another feature of a manufacturing method of a semiconductor device of the present invention, instead of separating or cleaving a bond substrate after bonding the bond substrate to the base substrate to form semiconductor films, a plurality of semiconductor films formed by separating or cleaving the bond substrate at a plurality of portions are attached to a base substrate. Then, at least one of the plurality of semiconductor films is processed into a desired shape and a semiconductor element is formed using the processed semiconductor film.

According to one feature of a manufacturing apparatus of a semiconductor device of the present invention, the manufacturing apparatus has at least a collet (a holder) which picks up one of a plurality of semiconductor films formed by separating or cleaving a bond substrate; a collet driving portion which controls the position of the collet; a stage which supports the bond substrate; a stage which holds the base substrate; a stage driving portion which controls the positions of the stages; a CPU which controls the operation of the collet driving portion and the stage driving portion in accordance with the positional information of the collet and the positional information of the stages.

According to another feature of a manufacturing method of a semiconductor device of the present invention, a plurality of semiconductor films formed using a plurality of bond substrates are bonded to one base substrate; therefore, the large-sized base substrate can be processed. Further, crystal plane orientation of a semiconductor film can be selected as appropriate in accordance with the polarity of a semiconductor element; therefore, the mobility of the semiconductor element can be increased, so that a semiconductor device capable of higher speed drive can be provided.

According to another feature of a manufacturing method of a semiconductor device of the present invention, the bond substrate is separated or cleaved at a plurality of portions, whereby a plurality of semiconductor films can be formed and bonded to the base substrate; therefore, a position where each of the plurality of semiconductor films is bonded can be selected in accordance with the polarity and the layout of the semiconductor element in the semiconductor device.

According to another feature of a manufacturing apparatus of a semiconductor device of the present invention, a plurality of semiconductor films formed using a plurality of bond substrates can be bonded to a base substrate as appropriate in accordance with the mask data of the semiconductor films.

BRIEF DESCRIPTION OF THE DRAWINGS

In the accompanying drawing:

FIG. 4 illustrates a state in which semiconductor films formed using a plurality of bond substrates are bonded to a base substrate;

FIG. 18 illustrates a structure of a semiconductor device formed by a manufacturing method of the present invention;

DETAILED DESCRIPTION OF THE PRESENT INVENTION

Hereinafter, embodiment modes and embodiments of the present invention will be described with reference to the drawings. However, the present invention can be embodied in many different modes and it is easily understood by those skilled in the art that modes and details can be variously changed without departing from the scope and the spirit of the present invention. Therefore, the present invention should not be limited to the descriptions of the embodiment modes and embodiments below.

Embodiment Mode 1

In this embodiment mode, an example of a manufacturing method of a semiconductor device of the present invention will be described.

Figure 1A:
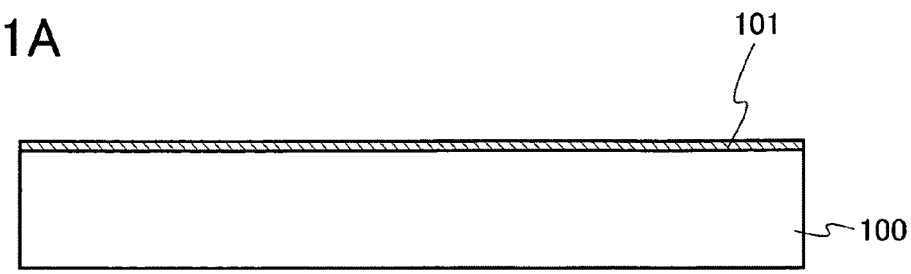
FIGS. 1A to 1D illustrate a manufacturing method of a semiconductor device of the present invention.

First, as illustrated in FIG. 1A, an insulating film 101 is formed over a bond substrate 100. As the bond substrate 100, a single crystal semiconductor substrate of silicon, germanium, or the like or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 100. In addition, as the bond substrate 100, a semiconductor substrate formed of silicon having lattice distortion, silicon germanium in which germanium is added to silicon, or the like may also be used. Silicon having lattice distortion can be formed by deposition of silicon on silicon germanium or silicon nitride which has a larger lattice constant than silicon.

The insulating film 101 is formed using an insulating material such as silicon oxide, silicon nitride oxide, silicon oxynitride or silicon nitride. The insulating film 101 may be either a single insulating film or a plurality of stacked insulating films. For example, in this embodiment mode, silicon oxide is used as the insulating film 101.

Note that silicon oxynitride means a substance which contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide means a substance which contains more nitrogen than oxygen and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. Note that the percentages of nitrogen, oxygen, silicon, and hydrogen fall within the ranges given above, where the total number of atoms contained in silicon oxynitride or silicon nitride oxide is defined as 100 at. %.

In the case of using silicon oxide for the insulating film 101, the insulating film 101 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 101 may be densified with oxygen plasma treatment. In the case of using silicon nitride for the insulating film 101, the insulating film 101 can be formed by a vapor deposition method such as a plasma CVD method using a mixed gas of silane and ammonia. In the case of using silicon nitride oxide for the insulating film 101, the insulating film 101 can be formed by a vapor deposition method such as a plasma CVD method using a mixed gas of silane and ammonia or a mixed gas of silane and nitrogen oxide.

Further, the insulating film 101 may be formed using silicon oxide which is formed by a chemical vapor deposition method using an organosilane gas. As the organosilane gas, any of the following silicon-containing compounds may be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

Figure 1B:
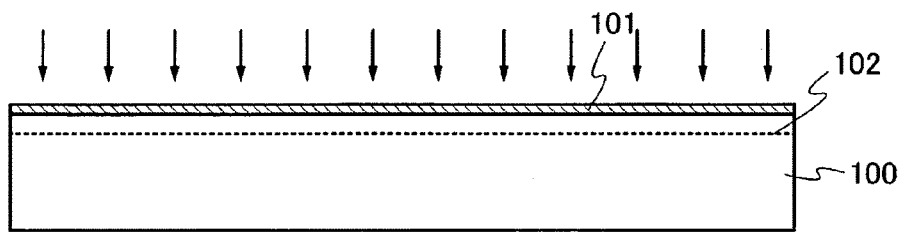

Next, as illustrated in FIG. 1B, the bond substrate 100 is irradiated with hydrogen or a rare gas, or hydrogen ions or rare gas ions as indicated by arrows, whereby a defect layer 102 having microvoids is formed in a region at a predetermined depth from the surface of the bond substrate 100. Alternatively, the defect layer 102 may be formed by using laser light. The position where the defect layer 102 is formed is determined depending on acceleration voltage at the time of the above-described irradiation. The thicknesses of semiconductor films 106 and a semiconductor film 108 which are formed using the bond substrate 100 are determined depending on the position where the defect layer 102 is formed; therefore, the acceleration voltage at the time of the above-described irradiation is determined in consideration of the thicknesses of the semiconductor films 106 and the semiconductor film 108. The position where the defect layer 102 is formed can be changed not only depending on the acceleration voltage at the time of the above-described irradiation but also depending on the thickness of the insulating film 101. For example, the thickness of the insulating film 101 is made larger, whereby the thicknesses of the semiconductor films 106 and the semiconductor film 108 can be made smaller. The thicknesses of the semiconductor films 106 and the semiconductor film 108 each are, for example, 10 nm to 200 nm, and preferably 10 nm to 50 nm. For example, when the bond substrate 100 is irradiated with hydrogen, the dose is preferably $1 \times 10^{16}/cm^2$ to $1 \times 10^{17}/cm^2$. In this embodiment mode, the bond substrate 100 is irradiated with hydrogen or hydrogen ions with an acceleration voltage of 40 kV and a dose of $1.75 \times 10^{16}/cm^2$.

Note that in the above-described step of forming the defect layer 102, the bond substrate 100 is irradiated with hydrogen or a rare gas, or hydrogen ions or rare gas ions at high concentration, which may cause roughness of the surface of the bond substrate 100 and variation in interface state density between the semiconductor film which is formed using the bond substrate 100 and a gate insulating film which is in contact with the semiconductor film. By providing the insulating film 101, the surface of the bond substrate 100 is protected at the time of the irradiation with hydrogen or a rare gas, or hydrogen ions or rare gas ions, the surface of the bond substrate 100 can be prevented from being roughened, and generation of variation in interface state density described above can be prevented.

Figure 1C:
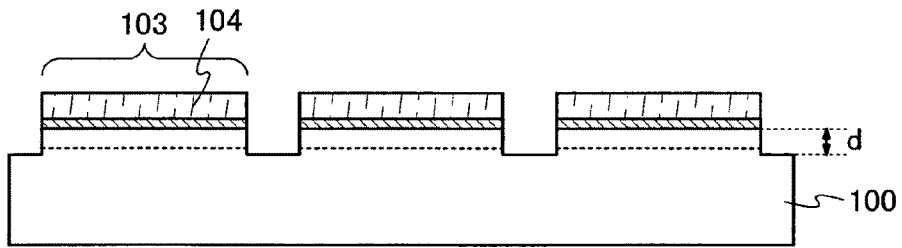

Next, the bond substrate 100 is partially removed. In this embodiment mode, as illustrated in FIG. 1C, the bond substrate 100 as well as the insulating film 101 is partially etched away using masks 104, so that the bond substrate 100 having a plurality of projections 103 is formed.

In the bond substrate 100, each of the plurality of projections 103 has a width d in a direction (a depth direction) perpendicular to the bond substrate 100. The width d is greater than or equal to the depth of the defect layer 102. The width d of each of the projections 103 in the direction (the depth direction) perpendicular to the bond substrate 100 is not necessarily constant and may have different values depending on the location. Specifically, the width d is set at, for example, greater than or equal to 10 nm, and preferably greater than or equal to 200 nm in consideration of the thickness of the semiconductor films 106.

The bond substrate 100 sometimes warps, bends, or has a little round edge. Moreover, in some cases, at the time of irradiating with hydrogen or a rare gas, or hydrogen ions or rare gas ions for separating a semiconductor film from the bond substrate 100, the gas or the ions cannot be added sufficiently at an edge of the bond substrate 100. Therefore, it is difficult to separate the semiconductor film at the edge of the bond substrate 100. Accordingly, the plurality of projections 103 of the bond substrate 100 are preferably formed at a predetermined distance from the rim of the bond substrate 100. The semiconductor film can be formed by separation or cleavage with excellent reproducibility by forming the projection 103 at a predetermined distance from the rim of the bond substrate 100. For example, it is preferable that the projection 103 which is positioned closest to the edge of the substrate have a distance of several tens of micrometers to several tens of millimeters from the rim of the bond substrate 100.

Next, heat treatment is performed after removing the masks 104, whereby microvoids adjacent to each other in the defect layer 102 are combined and the microvoids increase in volume. As a result, the bond substrate 100 is separated or cleaved at the defect layer 102, so that the semiconductor films 106 which are part of the projections 103 are separated from the bond substrate 100 together with the insulating film 101. The heat treatment may be performed, for example, at a temperature ranging from 400° C. to 600° C.

Note that the heat treatment may be performed by dielectric heating with high frequency waves such as microwaves. The heat treatment by the dielectric heating can be performed by irradiating the bond substrate 100 with high frequency waves generated at a high-frequency generator, which are ranging from 300 MHz to 3 THz. Specifically, for example, the bond substrate 100 is irradiated with a microwave with a frequency of 2.45 GHz at 900 W for 14 minutes so that the microvoids adjacent to each other in the defect layer are combined, whereby the bond substrate 100 can be separated or cleaved.

Figure 1D:
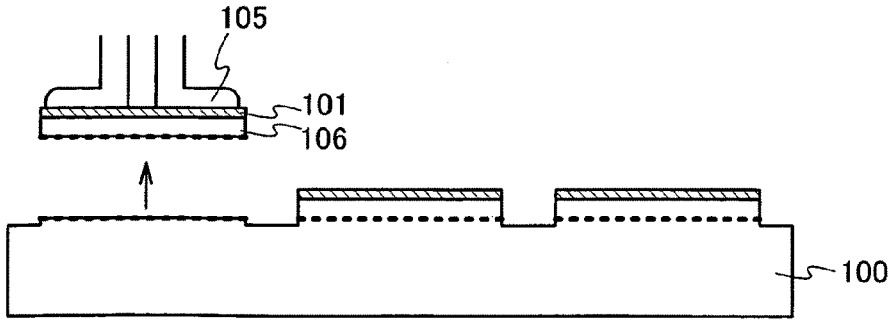

Then, as illustrated in FIG. 1D, a collet 105 is attached firmly to the insulating film 101 which is formed over one of the semiconductor films 106, and the semiconductor film 106 is separated from the bond substrate 100. Even when separation or cleavage of the bond substrate 100 by the heat treatment is incomplete, the semiconductor film 106 can be completely separated from the bond substrate 100 by application of force using the collet 105. The collet 105 may be a means which can be firmly attached to a selected one of the projections 103, for example, a chuck such as a vacuum chuck or a mechanical chuck, a microneedle to the tip of which an adhesive is attached, or the like is used. FIG. 1D illustrates a case in which a vacuum chuck is used as the collet 105.

As an adhesive which is attached to a microneedle, an epoxy-based adhesive, a ceramic-based adhesive, a silicone-based adhesive, a low-temperature coagulant, or the like can be used. For example, MW-1 (manufactured by Eminent Supply Corporation) can be used as the low-temperature coagulant. The coagulation point of MW-1 is approximately at 17° C., and MW-1 has a bonding effect at a temperature less than or equal to the coagulation point (preferably at less than or equal to 10° C.) and does not have a bonding effect at a temperature greater than or equal to the coagulation point (preferably approximately 25° C.).

Note that before separating or cleaving the bond substrate 100, hydrogenation may be performed on the bond substrate 100. The hydrogenation is performed, for example, at 350° C. in a hydrogen atmosphere for approximately two hours.

Figure 2A:
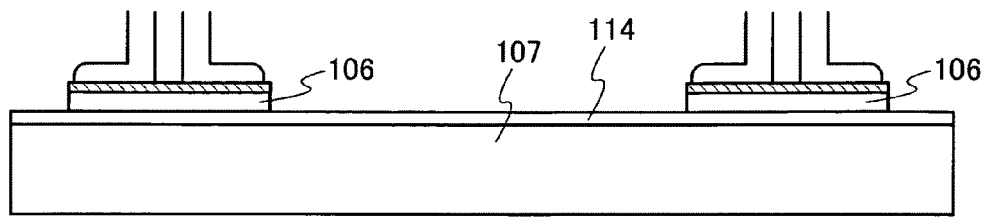
FIGS. 2A to 2C illustrate the manufacturing method of the semiconductor device of the present invention.

Next, as illustrated in FIG. 2A, the semiconductor films 106 and a base substrate 107 are bonded to each other so that surfaces of the semiconductor films 106 which are exposed by separation face the base substrate 107. In this embodiment mode, an insulating film 114 is formed over the base substrate 107. The insulating film 114 and the semiconductor films 106 are bonded to each other, whereby the semiconductor films 106 and the base substrate 107 can be bonded to each other. After bonding the semiconductor film 106 and the insulating film 114 to each other, heat treatment is preferably performed at 400° C. to 600° C. in order to further strengthen the bonding.

The semiconductor film 106 and the base substrate 107 are bonded to each other by van der Waals forces, so that they are firmly attached to each other even at room temperature. Note that since the above-described bonding can be performed at a low temperature, various substrates can be used as the base substrate 107. As the base substrate 107, for example, a glass substrate formed using aluminosilicate glass, barium borosilicate glass, aluminoborosilicate glass, or the like; a quartz substrate; a sapphire substrate; or the like can be used. Furthermore, as the base substrate 107, a semiconductor substrate formed using silicon, gallium arsenide, indium phosphide, or the like can be used. Alternatively, a metal substrate including a stainless steel substrate may be used as the base substrate 107.

Note that the insulating film 114 is not necessarily formed over the surface of the base substrate 107. Even when the insulating film 114 is not formed, the base substrate 107 and the semiconductor films 106 can be bonded to each other. Note that when the insulating film 114 is formed over the surface of the base substrate 107, it is possible to prevent impurities such as an alkali metal or an alkaline earth metal in the base substrate 107 from entering the semiconductor films 106.

When the insulating film 114 is formed, not the base substrate 107 but the insulating film 114 is bonded to the semiconductor films 106; therefore, more kinds of substrates can be used as the base substrate 107. A substrate made of a flexible synthetic resin such as plastic generally tends to have a lower allowable temperature limit; however, when the insulating film 114 is formed, the substrate can be used as the base substrate 107 as long as it can withstand a processing temperature in a manufacturing process. As a plastic substrate, polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like can be used.

Note that before or after bonding the semiconductor films 106 to the base substrate 107, the surfaces of the semiconductor films 106 which are exposed by separation may be subjected to thermal annealing by laser light irradiation. When thermal annealing is performed before bonding the semiconductor films 106 to the base substrate 107, the surfaces of the semiconductor films 106 which are exposed by separation are planarized, so that the bonding strength can be further increased. When thermal annealing is performed after bonding the semiconductor films 106 to the base substrate 107, the semiconductor films 106 are partially melted, so that the bonding strength can be further increased.

When thermal annealing by laser light irradiation is performed, the semiconductor films 106 are preferably irradiated with a fundamental wave or a second harmonic of a solid-state laser which is selectively absorbed by the semiconductor. For example, laser light which is emitted from a continuous wave YAG laser having an output of 100 W is used. Then, it is preferable to shape the laser light into a rectangular or elliptical shape on an irradiation surface by an optical system so that the surfaces of the semiconductor films 106 which are exposed by separation are irradiated with the laser light. The laser is required to have a power density of approximately 1 kW/cm$^2$ to 100 MW/cm$^2$ (preferably, 0.1 MW/cm$^2$ to 10 MW/cm$^2$). The irradiation is then performed at a scan speed ranging from approximately 10 cm/sec to 2000 cm/sec.

A continuous-wave gas laser, such as an Ar laser, a Kr laser, or the like can be used. Following continuous-wave solid-state laser can be used: a YAG laser, a YVO$_4$ laser, a YLF laser, a YAlO$_3$ laser, a forsterite (Mg$_2$SiO$_4$) laser, a GdVO$_4$ laser, a Y$_2$O$_3$ laser, a glass laser, a ruby laser, an alexandrite laser, a Ti:sapphire laser, or the like. A pulsed oscillation laser, such as an Ar laser, a Kr laser, an excimer laser, a CO$_2$ laser, a YAG laser, a Y$_2$O$_3$ laser, a YVO$_4$ laser, a YLF laser, a YAlO$_3$ laser, a glass laser, a ruby laser, an alexandrite laser, a Ti:sapphire laser, a copper vapor laser, or a gold vapor laser can be used, for example.

Instead of attaching the semiconductor films 106 to the base substrate 107 only by bonding them to each other, the following method may be employed: a high-frequency vibration of approximately 10 MHz to 1 THz is applied to the semiconductor films 106, whereby frictional heat is generated between the semiconductor films 106 and the base substrate 107. The semiconductor films 106 are partially melted by the frictional heat, so that the semiconductor films 106 are bonded to the base substrate 107.

Note that when MW-1 is used as a low-temperature coagulant, at a temperature at which a low-temperature coagulant does not have a bonding effect (for example, approximately at 25° C.), the low-temperature coagulant which is attached to the tip of the microneedle is brought into contact with the insulating film 101 on one of the projections 103. Next, the temperature is lowered to a temperature at which the low-temperature coagulant has a bonding effect (for example, approximately at 5° C.) to coagulate the low-temperature coagulant, whereby the insulating film 101 on one of the projections 103 and the microneedle are attached firmly to each other. Then, after bonding one of the semiconductor films 106 which is separated from the bond substrate 100 to the base substrate 107, the temperature is raised up again to a temperature at which the low-temperature coagulant does not have a bonding effect (for example, approximately at 25° C.), whereby the microneedle can be separated from the semiconductor film 106.

Figure 2B:
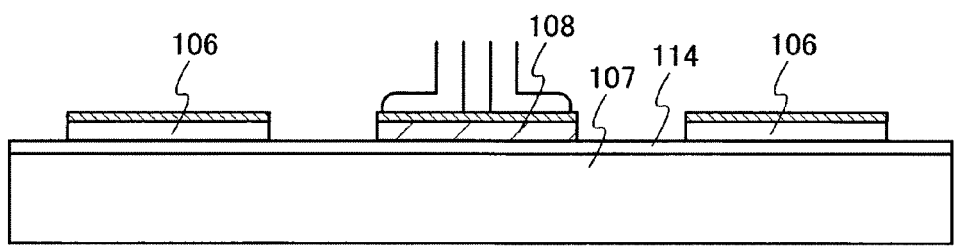

Next, as illustrated in FIG. 2B, a bond substrate having crystal plane orientation different from that of the bond substrate 100 used for forming the semiconductor films 106 is prepared, and then the semiconductor film 108 is separated from the bond substrate in a similar manner to the semiconductor films 106 to be bonded to the base substrate 107.

The mobility of majority carriers in a semiconductor depends on crystal plane orientation. Accordingly, the bond substrate having crystal plane orientation which is suitable for a semiconductor element to be formed may be selected as appropriate to form the semiconductor films 106 or the semiconductor film 108. For example, when an n-type semiconductor element is formed using one of the semiconductor films 106, the mobility of majority carriers in the semiconductor element can be increased by forming the semiconductor film 106 having a face {100}. Meanwhile, when a p-type semiconductor element is formed using the semiconductor film 108, the mobility of majority carriers in the semiconductor element can be increased by forming the semiconductor film 108 having a face {110}. When a transistor is formed as a semiconductor element, the bonding direction of the semiconductor films 106 or the semiconductor film 108 is set in consideration of the channel direction and the crystal plane orientation Note that as described above, the bond substrate sometimes warps, bends, or has a little round edge. Moreover, in some cases, at the time of irradiating with hydrogen or a rare gas, or hydrogen ions or rare gas ions for separating a semiconductor film from the bond substrate, the gas or the ions cannot be added sufficiently at an edge of the bond substrate. Therefore, it is difficult to separate the semiconductor film at the edge of the bond substrate. When semiconductor films are formed by separating or cleaving the bond substrate after bonding the bond substrate to the base substrate, the distance between the semiconductor films is several millimeters to several centimeters; however, in the present invention, before bonding the bond substrate to the base substrate 107, the bond substrate is separated or cleaved to form the semiconductor films 106 and the semiconductor film 108. Accordingly, when the semiconductor films 106 and the semiconductor film 108 are bonded to the base substrate 107, the distance between each of the semiconductor films 106 and the semiconductor film 108 can be reduced to approximately several tens of micrometers. A semiconductor device can be manufactured easily without the influence of the space between each of the semiconductor films 106 and the semiconductor film 108.

FIG. 4 illustrates a state in which a semiconductor film 163 and a semiconductor film 164 are separated from a bond substrate 160 and a bond substrte 161 which have different crystal plane orientations, respectively, and the semiconductor film 163 and the semiconductor film 164 are bonded to a base substrate 162. The position where the semiconductor film 163 and the semiconductor film 164 are bonded to the base substrate 162 can be determined based on the mask data of a semiconductor element. Note that FIG. 4 illustrates an example in which the semiconductor film 163 and the semiconductor film 164 are separated from the two bond substrates 160 and 161, respectively; however, three or more bond substrates may be used.

Figure 2C:
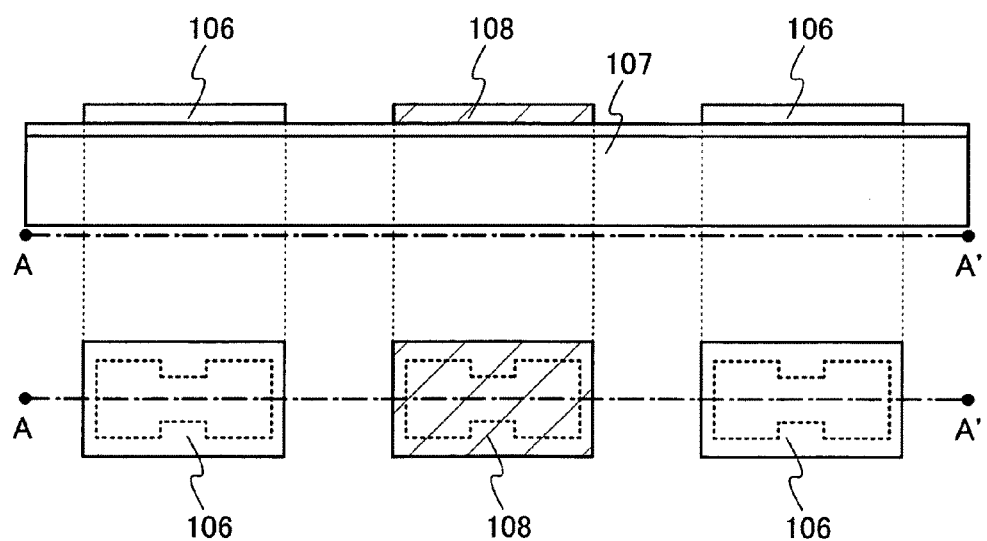

Next, as illustrated in FIG. 2C, the insulating film 101 which is formed over the semiconductor films 106 and the semiconductor film 108 is removed. FIG. 2C illustrates a top view as well as a cross-sectional view of the semiconductor films 106 and the semiconductor film 108. The cross-sectional view illustrated in FIG. 2C corresponds to a cross section taken along a dashed line A-A' of the top view.

Figure 3A:
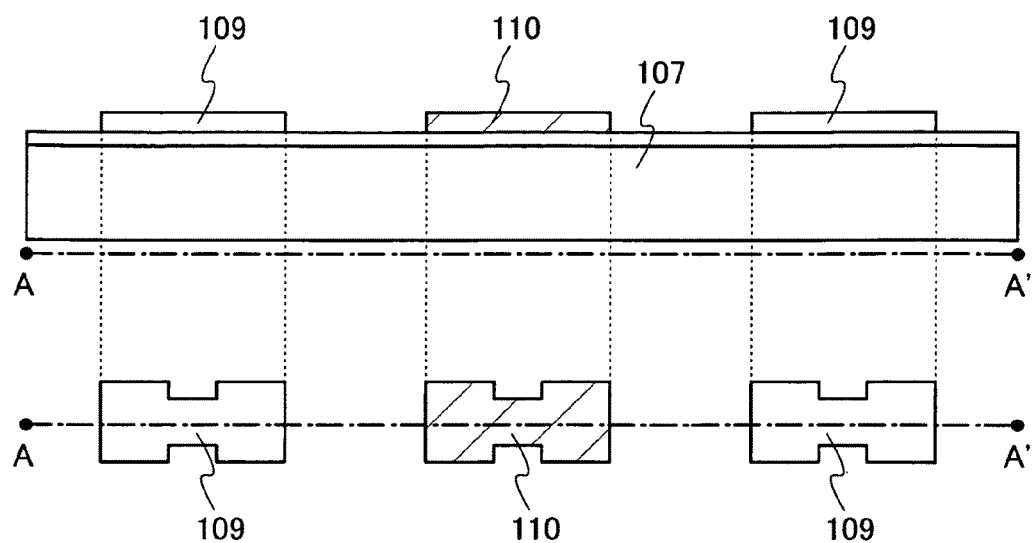
FIGS. 3A and 3B illustrate the manufacturing method of the semiconductor device of the present invention.

Next, as illustrated in FIG. 3A, the semiconductor films 106 and the semiconductor film 108 are partially etched, so that semiconductor films 109 are formed using the semiconductor films 106 and a semiconductor film 110 is formed using the semiconductor film 108. FIG. 3A illustrates a top view as well as a cross-sectional view of the semiconductor films 109 and the semiconductor film 110. The cross-sectional view illustrated in FIG. 3A corresponds to a cross section taken along a dashed line A-A' of the top view. When the semiconductor films 106 and the semiconductor film 108 are further etched, the edges of the semiconductor films 106 and the semiconductor film 108 which do not have enough bonding strength can be removed.

Note that in this embodiment mode, one semiconductor film 106 is etched to form one semiconductor film 109, and one semiconductor film 108 is etched to form one semiconductor film 110; however, the present invention is not limited to this structure. For example, one semiconductor film 106 may be etched to form a plurality of semiconductor films 109, and one semiconductor film 108 may be etched to form a plurality of semiconductor films 110.

After forming the semiconductor films 109 and the semiconductor film 110 as illustrated in FIG. 3A, surfaces of the semiconductor films 109 and the semiconductor film 110 may be planarized. Although not necessarily essential, the planarization makes it possible to improve characteristics of the interface between a gate insulating film, and the semiconductor films 109 and the semiconductor film 110 in a transistor which is to be formed later. Specifically, the planarization can be performed by chemical mechanical polishing (CMP), liquid jet polishing, or the like. The thicknesses of the semiconductor films 109 and the semiconductor film 110 are reduced by the planarization. The planarization may be performed on the semiconductor films 109 and the semiconductor film 110 which are formed by etching or the semiconductor films 106 and the semiconductor film 108 before etching.

Note that the semiconductor film can be bonded to the base substrate so that the surface of the semiconductor film which is exposed by separation or cleavage and the gate insulating film are in contact with each other. Note that as described in this embodiment mode, when the surface of the semiconductor film which is exposed by separation or cleavage faces the base substrate, the other surface of the semiconductor film having higher planarity is in contact with the gate insulating film; therefore, interface state density between the semiconductor film and the gate insulating film can be decreased and can be made uniform. Accordingly, polishing for planarization of the surface of the semiconductor film which is in contact with the gate insulating film can be omitted or performed in less time, leading to reduction in cost and improvement in throughput.

The semiconductor films 109 and the semiconductor film 110, or the semiconductor films 106 and the semiconductor film 108 before etching may be irradiated with an energy beam to recover crystal defects. As the energy beam, a beam which is selectively absorbed in a semiconductor is used; for example, laser light is desirably used. As the laser light, a gas laser such as an excimer laser or a solid state laser such as a YAG laser can be used as a light source. The laser light preferably has a wavelength in the range of ultraviolet light to near-infrared light; specifically, laser light with a wavelength of 190 nm to 2000 nm is desirably used. Alternatively, flash lamp annealing which uses a halogen lamp, a xenon lamp, or the like may be performed to recover crystal defects.

Note that, although this embodiment mode describes the case of using a Smart Cut method in which the semiconductor films 106 and the semiconductor film 108 are separated from the bond substrate 100 by the formation of the defect layer 102, any other bonding method such as ELTRAN (epitaxial layer transfer), a dielectric isolation method, or a PACE (plasma assisted chemical etching) method may be used.

Figure 3B:
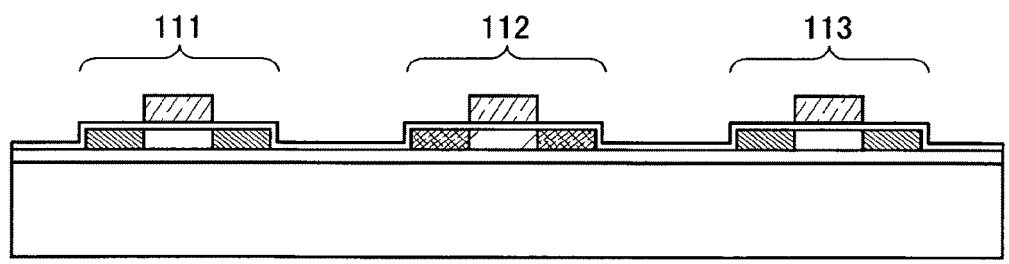

With the use of the semiconductor films 109 and the semiconductor film 110 which are formed through the above-described steps, as illustrated in FIG. 3B, various kinds of semiconductor elements such as transistors 111 to 113 can be formed.

In the manufacturing method of a semiconductor device of this embodiment mode, a plurality of semiconductor films are bonded to one base substrate using the plurality of bond substrates 100; therefore, the large-sized base substrate 107 can be processed. Further, crystal plane orientation of a semiconductor film can be selected as appropriate in accordance with the polarity of a semiconductor element; therefore, the mobility of the semiconductor element can be increased, so that a semiconductor device capable of operating at a higher speed can be provided.

Further, according to one feature of the manufacturing method of a semiconductor device of the present invention, the bond substrate 100 is separated or cleaved at a plurality of portions, whereby a plurality of semiconductor films 106 can be formed and bonded to the base substrate; therefore, a position where each of the plurality of semiconductor films 106 is bonded can be selected in accordance with the polarity and the layout of a semiconductor element in the semiconductor device.

The present invention can be applied to manufacture any kind of semiconductor devices including microprocessors, integrated circuits such as image processing circuits, RF tags for transmitting and receiving data to/from an interrogator without contact, semiconductor display devices, and the like. The semiconductor display device includes in its category, a liquid crystal display device, a light-emitting device provided with a light-emitting element typified by an organic light-emitting diode (an OLED) in each pixel, a DMD (a digital micromirror device), a PDP (a plasma display panel), an FED (a field emission display), and the like, and also includes another semiconductor display device having a circuit element using a semiconductor film in a driver circuit.

Embodiment Mode 2

In this embodiment mode, a manufacturing method of a semiconductor device of the present invention will be described, in which a defect layer is formed in a bond substrate by doping instead of by etching to form the projections of the bond substrate as described in Embodiment Mode 1.

Figure 5A:
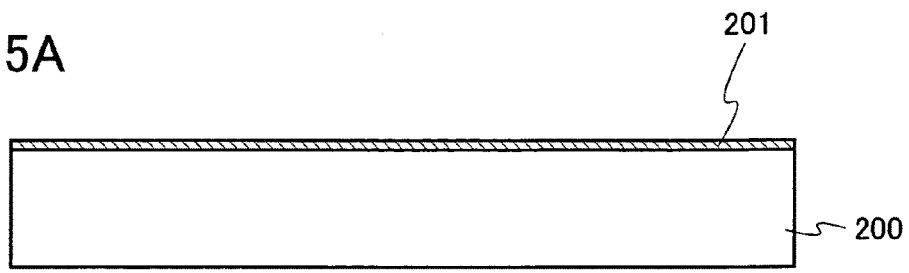
FIGS. 5A to 5D illustrate a manufacturing method of a semiconductor device of the present invention.

First, as illustrated in FIG. 5A, an insulating film 201 is formed over a bond substrate 200. As the bond substrate 200, a single crystal semiconductor substrate of silicon, germanium, or the like or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 200. In addition, as the bond substrate 200, a semiconductor substrate formed of silicon having lattice distortion, silicon germanium in which germanium is added to silicon, or the like may also be used. Silicon having lattice distortion can be formed by deposition of silicon on silicon germanium or silicon nitride which has a larger lattice constant than silicon.

The insulating film 201 is formed using an insulating material such as silicon oxide, silicon nitride oxide, silicon oxynitride or silicon nitride. The insulating film 201 may be either a single insulating film or a plurality of stacked insulating films. For example, in this embodiment mode, silicon oxide is used as the insulating film 201.

In the case of using silicon oxide for the insulating film 201, the insulating film 201 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 201 may be densified with oxygen plasma treatment. In the case of using silicon nitride for the insulating film 201, the insulating film 201 can be formed by a vapor deposition method such as a plasma CVD method using a mixed gas of silane and ammonia. In the case of using silicon nitride oxide for the insulating film 201, the insulating film 201 can be formed by a vapor deposition method such as a plasma CVD method using a mixed gas of silane and ammonia or a mixed gas of silane and nitrogen oxide.

Further, the insulating film 201 may be formed using silicon oxide which is formed by a chemical vapor deposition method using an organosilane gas. As the organosilane gas, any of the following silicon-containing compounds may be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

Figure 5B:
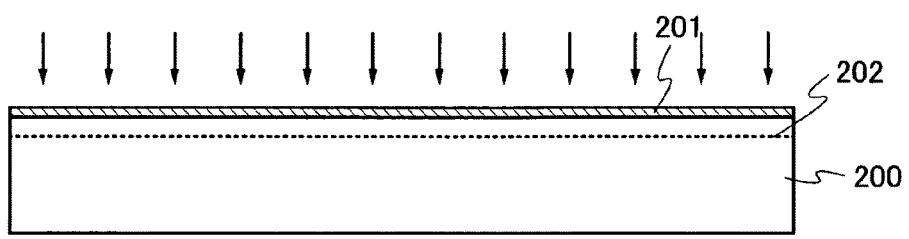
Figure 5C:
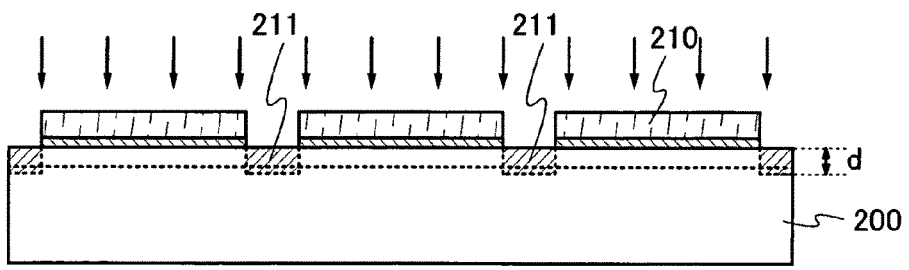

Next, as illustrated in FIG. 5B, the bond substrate 200 is irradiated with hydrogen or a rare gas, or hydrogen ions or rare gas ions as indicated by arrows, whereby a defect layer 202 having microvoids is formed in a region at a predetermined depth from the surface of the bond substrate 200. Alternatively, the defect layer 202 may be formed by using laser light. The position where the defect layer 202 is formed is determined depending on acceleration voltage at the time of the above-described irradiation. The thickness of semiconductor films 206 which are formed using the bond substrate 200 is determined depending on the position where the defect layer 202 is formed; therefore, the acceleration voltage at the time of the above-described irradiation is determined in consideration of the thickness of the semiconductor films 206. The position where the defect layer 202 is formed can be changed not only depending on the acceleration voltage at the time of the above-described irradiation but also depending on the thickness of the insulating film 201. For example, the thickness of the insulating film 201 is made larger, whereby the thickness of the semiconductor films 206 can be made smaller. The thickness of the semiconductor films 206 is, for example, 10 nm to 200 nm, and preferably 10 nm to 50 nm. For example, when the bond substrate 200 is irradiated with hydrogen, the dose is preferably $1\times10^{16}/cm^2$ to $1\times10^{17}/cm^2$. In this embodiment mode, the bond substrate 200 is irradiated with hydrogen or hydrogen ions with an accelerating voltage of 40 kV and a dose of $1.75\times10^{16}/cm^2$.

Note that in the above-described step of forming the defect layer 202, the bond substrate 200 is irradiated with hydrogen or a rare gas, or hydrogen ions or rare gas ions at high concentration, which may cause roughness of the surface of the bond substrate 200 and variation in interface state density between the semiconductor film which is formed using the bond substrate 200 and an gate insulating film which is in contact with the semiconductor film. By providing the insulating film 201, the surface of the bond substrate 200 is protected at the time of the irradiation with hydrogen or a rare gas, or hydrogen ions or rare gas ions, the surface of the bond substrate 200 can be prevented from being roughened, and generation of variation in interface state density described above can be prevented.

Next, masks 210 are formed over the insulating film 201. The bond substrate 200 is selectively irradiated with hydrogen or a rare gas, or hydrogen ions or rare gas ions as indicated by arrows, whereby defect layers 211 having microvoids are formed. The defect layers 211 are formed by irradiating with a higher dose of gas or ions or with a larger mass of gas or ions than that used for forming the defect layer 202. By the above-described conditions, the width of each of the defect layers 211 in a depth direction of the bond substrate 200 can be made wider. For example, when the bond substrate 200 is irradiated with hydrogen, the dose is preferably $5\times10^{17}/cm^2$ to $5\times10^{18}/cm^2$. In this embodiment mode, the bond substrate 200 is irradiated with hydrogen or hydrogen ions with an accelerating voltage of 40 kV and a dose of $1\times10^{18}/cm^{18}/cm^2$.

The width d of each of the defect layers 211 in the direction (the depth direction) perpendicular to the bond substrate 200 is desirably greater than or equal to the depth of the defect layer 202. Specifically, the width d is, for example, greater than or equal to 10 nm, and preferably greater than or equal to 200 nm in consideration of the thickness of the semiconductor films 206.

The bond substrate 200 sometimes warps, bends, or has a little round edge. Moreover, in some cases, at the time of irradiating with hydrogen or a rare gas, or hydrogen ions or rare gas ions for separating a semiconductor film from the bond substrate 200, the ions or the like cannot be added sufficiently at an edge of the bond substrate 200. Therefore, it is difficult to separate the semiconductor film at the edge of the bond substrate 200. Accordingly, the defect layer 211 is preferably formed at the edge of the bond substrate 200. By forming the defect layer 211 at the edge of the bond substrate 200, a semiconductor film can be formed by separation or cleavage with excellent reproducibility. For example, the width of the defect layer 211 which is positioned at the edge, in a direction perpendicular to the width d is preferably several tens of micrometers to several tens of millimeters.

Next, heat treatment is performed after removing the masks 210, whereby microvoids adjacent to each other in the defect layer 202 and the defect layers 211 are combined and the microvoids increase in volume. As a result, the bond substrate 200 is separated or cleaved at the defect layer 202 and the defect layers 211, so that the semiconductor films 206 are separated from the bond substrate 200 together with the insulating film 201. The heat treatment may be performed, for example, at a temperature ranging from 400° C. to 600° C.

Note that the heat treatment may be performed by dielectric heating with high frequency waves such as microwaves. The heat treatment by the dielectric heating can be performed by irradiating the bond substrate 200 with high frequency waves generated at a high-frequency generator, which are ranging from 300 MHz to 3 THz. Specifically, for example, the bond substrate 200 is irradiated with a microwave with a frequency of 2.45 GHz at 900 W for 14 minutes so that the microvoids adjacent to each other in the defect layers are combined, whereby the bond substrate 200 can be separated or cleaved.

Figure 5D:
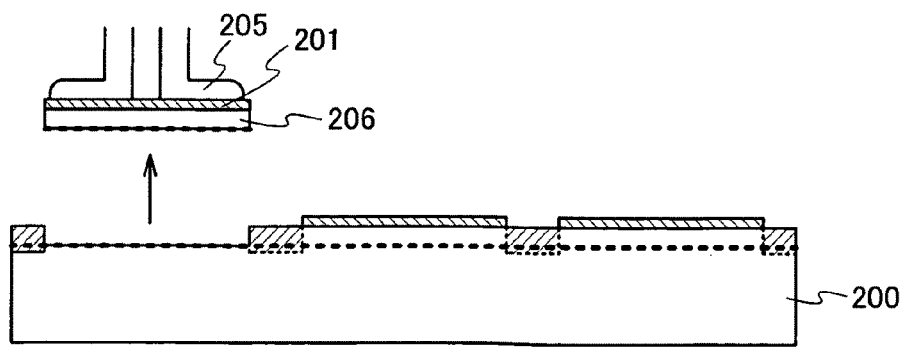

Then, as illustrated in FIG. 5D, a collet 205 is firmly attached to the insulating film 201 which is formed over one of the semiconductor films 206, and the semiconductor film 206 is separated from the bond substrate 200. Even when separation or cleavage of the bond substrate 200 by the heat treatment is incomplete, the semiconductor film 206 can be completely separated from the bond substrate 200 by application of force using the collet 205. The collet 205 may be a means which can be firmly attached to a selected one of the semiconductor films 206, for example, a chuck such as a vacuum chuck or a mechanical chuck, a microneedle to the tip of which an adhesive is attached, or the like is used. FIG. 5D illustrates a case in which a vacuum chuck is used as the collet 205.

Note that before separating or cleaving the bond substrate 200, hydrogenation may be performed on the bond substrate 200. The hydrogenation is performed, for example, at 350° C. in a hydrogen atmosphere for approximately two hours.

As an adhesive which is attached to a microneedle, an epoxy-based adhesive, a ceramic-based adhesive, a silicone-based adhesive, a low-temperature coagulant, or the like can be used. For example, MW-1 (manufactured by Eminent Supply Corporation) can be used as the low-temperature coagulant.

The following steps are performed in a similar manner to the manufacturing method described in Embodiment Mode 1, and thus a semiconductor device of the present invention can be manufactured.

Embodiment Mode 3

In this embodiment mode, one of a manufacturing method of a semiconductor device using the present invention will be described.

Figure 6A:
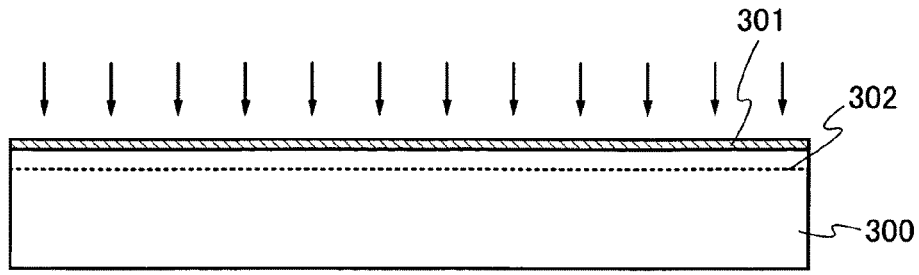
FIGS. 6A to 6D illustrate the manufacturing method of the semiconductor device of the present invention.

First, as illustrated in FIG. 6A, an insulating film 301 is formed over a bond substrate 300. As the bond substrate 300, a single crystal semiconductor substrate of silicon, germanium, or the like or a polycrystalline semiconductor substrate of silicon, germanium, or the like can be used. In addition, a single crystal semiconductor substrate or a polycrystalline semiconductor substrate formed of a compound semiconductor such as gallium arsenide or indium phosphide can be used as the bond substrate 300. In addition, as the bond substrate 300, a semiconductor substrate formed of silicon having lattice distortion, silicon germanium in which germanium is added to silicon, or the like may also be used. Silicon having lattice distortion can be formed by deposition of silicon on silicon germanium or silicon nitride which has a larger lattice constant than silicon.

The insulating film 301 is formed using an insulating material such as silicon oxide, silicon nitride oxide, silicon oxynitride or silicon nitride. The insulating film 301 may be either a single insulating film or a plurality of stacked insulating films. For example, in this embodiment mode, the insulating film 301 is formed in which silicon oxynitride containing a larger amount of oxygen than nitrogen and silicon nitride oxide containing a larger amount of nitrogen than oxygen are stacked in this order from the side near the bond substrate 300.

In the case of using silicon oxide for the insulating film 301, the insulating film 301 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 301 may be densified with oxygen plasma treatment. In the case of using silicon nitride for the insulating film 301, the insulating film 301 can be formed by a vapor deposition method such as a plasma CVD method using a mixed gas of silane and ammonia. In the case of using silicon nitride oxide for the insulating film 301, the insulating film 301 can be formed by a vapor deposition method such as a plasma CVD method using a mixed gas of silane and ammonia or a mixed gas of silane and nitrogen oxide.

Further, the insulating film 301 may be formed using silicon oxide which is formed by a chemical vapor deposition method using an organosilane gas. As the organosilane gas, any of the following silicon-containing compounds may be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

Next, the bond substrate 300 is irradiated with hydrogen or a rare gas, or hydrogen ions or rare gas ions as indicated by arrows, whereby a defect layer 302 having microvoids is formed in a region at a predetermined depth from the surface of the bond substrate 300. Alternatively, the defect layer 302 may be formed by using laser light. The position where the defect layer 302 is formed is determined depending on acceleration voltage at the time of the above-described irradiation. The thicknesses of semiconductor films 306 and a semiconductor film 308 which are formed using the bond substrate 300 are determined depending on the position where the defect layer 302 is formed; therefore, the acceleration voltage at the time of the above-described irradiation is determined in consideration of the thicknesses of the semiconductor films 306 and the semiconductor film 308. The position where the defect layer 302 is formed can be changed not only depending on the acceleration voltage at the time of the above-described irradiation but also depending on the thickness of the insulating film 301. For example, the thickness of the insulating film 301 is made larger, whereby the thicknesses of the semiconductor film 306 and the semiconductor film 308 can be made smaller. The thicknesses of the semiconductor films 306 and the semiconductor film 308 each are, for example, 10 nm to 200 nm, and preferably 10 nm to 50 nm. For example, when the bond substrate 300 is irradiated with hydrogen, the dose is preferably $1 \times 10^{16}/cm^2$ to $1 \times 10^{17}/cm^2$. In this embodiment mode, the bond substrate 300 is irradiated with hydrogen or hydrogen ions with an accelerating voltage of 40 kV and a dose of $1.75 \times 10^{16}/cm^2$.

Note that in the above-described step of forming the defect layer 302, the bond substrate 300 is irradiated with hydrogen or a rare gas, or hydrogen ions or rare gas ions at high concentration, which may cause roughness of the surface of the bond substrate 300 and difficulty in obtaining sufficient bonding strength with the base substrate 307. By providing the insulating film 301, the surface of the bond substrate 300 is protected at the time of the irradiation with hydrogen or a rare gas, or hydrogen ions or rare gas ions, and bonding between the semiconductor films 306 and the semiconductor film 308 and the base substrate 307 can be performed excellently.

Figure 6B:
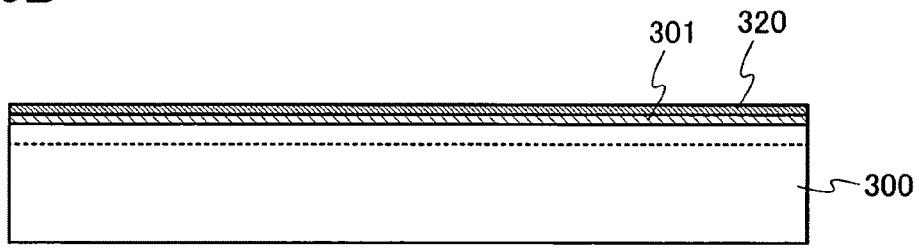

As illustrated in FIG. 6B, an insulating film 320 is formed over the insulating film 301. The insulating film 320 is formed using an insulating material such as silicon oxide, silicon nitride oxide, silicon oxynitride, or silicon nitride in a manner similar to the insulating film 301. The insulating film 320 may be either a single insulating film or a plurality of stacked insulating films. Alternatively, the insulating film 320 may be formed of silicon oxide which is formed by a chemical vapor deposition method using an organic silane gas. In this embodiment mode, silicon oxide formed by a chemical vapor deposition method using an organosilane gas is used for the insulating film 320.

When the insulating film 301 or the insulating film 320 is formed of silicon nitride, silicon nitride oxide, or the like which has a high barrier property, it is possible to prevent impurities such as an alkali metal and an alkaline earth metal in the base substrate 307 from entering the semiconductor films 306 and the semiconductor film 308 formed over the base substrate 307.

Although the insulating film 320 is formed after the defect layer 302 is formed in this embodiment mode, the insulating film 320 is not necessarily required. However, the insulating film 320 is formed after the defect layer 302 is formed; therefore, a surface of the insulating film 320 has planarity higher than that of the insulating film 301 which is formed before the defect layer 302 is formed. Accordingly, the strength of bonding which is performed in a later step can be increased by the formation of the insulating film 320.

Figure 6C:
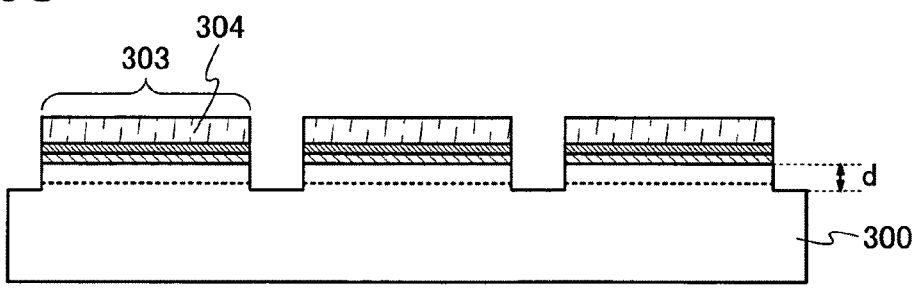
Figure 6D:
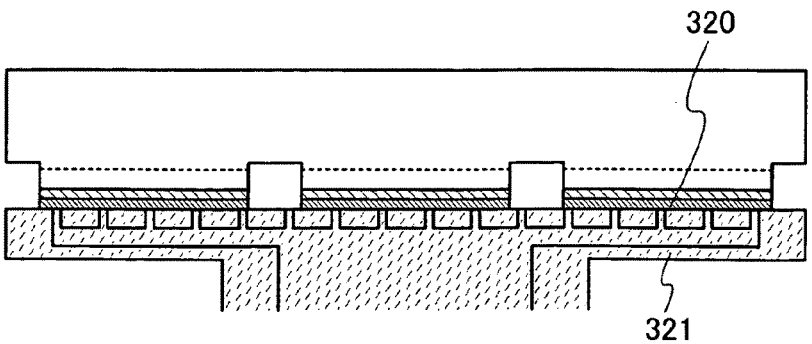

Next, the bond substrate 300 is partially removed. In this embodiment mode, as illustrated in FIG. 6C, the bond substrate 300 is partially etched away together with the insulating film 301 using masks 304, so that the bond substrate 300 having a plurality of projections 303 is formed.

In the bond substrate 300, each of the plurality of projections 303 has a width d in a direction (a depth direction) perpendicular to the bond substrate 300. The width d is greater than or equal to the depth of the defect layer 302. The width d of each of the projections 303 in the direction (the depth direction) perpendicular to the bond substrate 300 is not necessarily constant and may have different values depending on the location. Specifically, the width d is set at, for example, greater than or equal to 10 nm, and preferably greater than or equal to 200 nm in consideration of the thickness of the semiconductor films 306.

The bond substrate 300 sometimes warps, bends, or has a little round edge. Moreover, in some cases, at the time of irradiating with hydrogen or a rare gas, or hydrogen ions or rare gas ions for separating a semiconductor film from the bond substrate 300, the gas or the ions cannot be added sufficiently at an edge of the bond substrate 300. Therefore, it is difficult to separate the semiconductor film at the edge of the bond substrate 300. Accordingly, the plurality of projections 303 of the bond substrate 300 are preferably formed at a predetermined distance from the rim of the bond substrate 300. The semiconductor film can be formed by separation or cleavage with excellent reproducibility by forming the projection 303 at a predetermined distance from the rim of the bond substrate 300. For example, it is preferable that the projection 303 which is positioned closest to the edge of the substrate have a distance of several tens of micrometers to several tens of millimeters from the rim of the bond substrate 300.

Next, after removing the masks 304, the bond substrate 300 is firmly attached to a holding means 321. The bond substrate 300 is firmly attached to the holding means 321 so that the projections 303 face the holding means 321. As the holding means 321, a large vacuum chuck or a large mechanical chuck, specifically, a porous vacuum chuck, a non-contact vacuum chuck, or the like, which can withstand heat treatment to be performed later and which can be firmly attached to the plurality of projections 303 so as to overlap with the projections 303, can be used. In this embodiment mode, an example in which a vacuum chuck is used as the holding means 321 will be described.

Figure 7A:
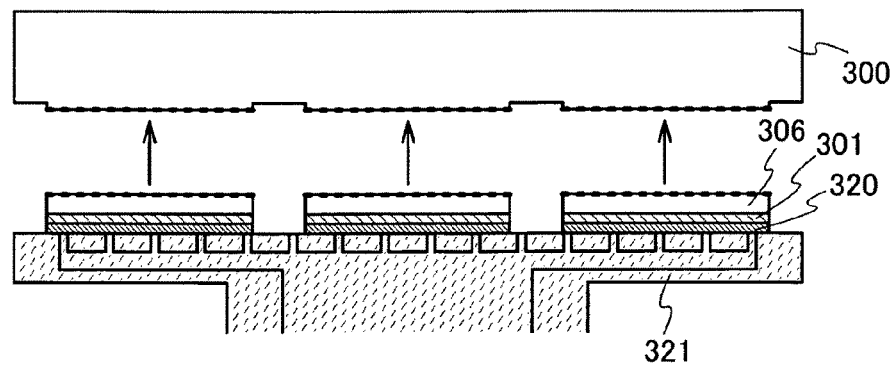
FIGS. 7A to 7C illustrate the manufacturing method of the semiconductor device of the present invention.

Next, heat treatment is performed, whereby microvoids adjacent to each other in the defect layer 302 are combined and the microvoids increase in volume. As a result, as illustrated in FIG. 7A, the bond substrate 300 is separated or cleaved at the defect layer 302, so that the semiconductor films 306 which are part of the projections 303 are separated from the bond substrate 300 together with the insulating film 301 and the insulating film 320. The heat treatment may be performed, for example, at a temperature ranging from 400° C. to 600° C.

Note that the heat treatment may be performed by dielectric heating with high frequency waves such as microwaves. The heat treatment by the dielectric heating can be performed by irradiating the bond substrate 300 with high frequency waves generated at a high-frequency generator, which are ranging from 300 MHz to 3 THz. Specifically, for example, the bond substrate 300 is irradiated with a microwave with a frequency of 2.45 GHz at 900 W for 14 minutes so that the microvoids adjacent to each other in the defect layer are combined, whereby the bond substrate 300 can be separated or cleaved.

Note that before separating or cleaving the bond substrate 300, hydrogenation may be performed on the bond substrate 300. The hydrogenation is performed, for example, at 350° C. in a hydrogen atmosphere for approximately two hours.

Figure 7B:
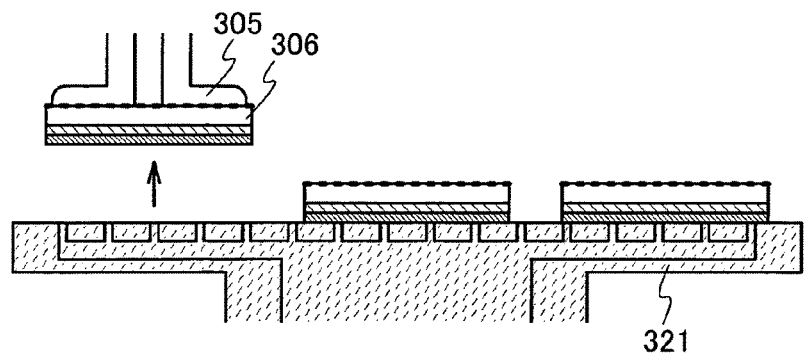

Then, as illustrated in FIG. 7B, a collet 305 is firmly attached to a surface of one of the semiconductor films 306 which is exposed by separation or cleavage, and the semiconductor film 306 is separated from the holding means 321. The collet 305 may be a means which can be firmly attached to a selected one of the projections 303, for example, a chuck such as a vacuum chuck or a mechanical chuck, a microneedle to the tip of which an adhesive is attached, or the like is used. FIG. 7B illustrates a case in which a vacuum chuck is used as the collet 305.

Note that, in this embodiment mode, an example in which the collet 305 is attached firmly to the surface of the semiconductor film 306 which is exposed by separation or cleavage is described; however, a protection film such as an insulating film, or the like may be formed in order to prevent the surface of the semiconductor film 306 which is exposed by separation or cleavage from being damaged by the collet 305. Note that the above-described protection film is removed after bonding the semiconductor film 306 to the base substrate 307.

As an adhesive which is attached to a microneedle, an epoxy-based adhesive, a ceramic-based adhesive, a silicone-based adhesive, a low-temperature coagulant, or the like can be used. For example, MW-1 (manufactured by Eminent Supply Corporation) can be used as the low-temperature coagulant. The coagulation point of MW-1 is approximately at 17° C., and MW-1 has a bonding effect at a temperature less than or equal to the coagulation point (preferably at less than or equal to 10° C.) and does not have a bonding effect at a temperature greater than or equal to the coagulation point (preferably approximately 25° C.).

Figure 7C:
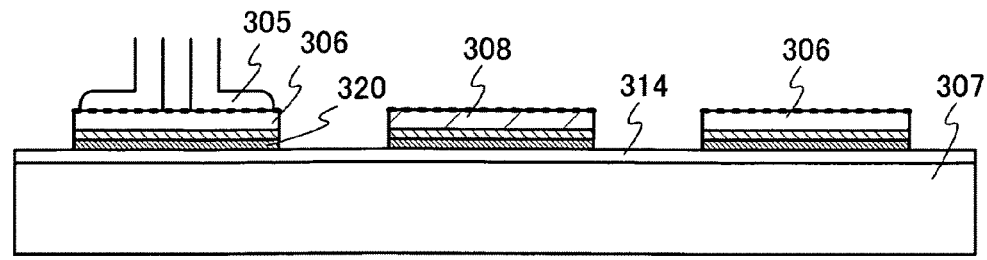

Next, as illustrated in FIG. 7C, the semiconductor films 306 and the base substrate 307 are bonded to each other so that the insulating film 320 faces the base substrate 307, that is, surfaces of the semiconductor films 306, which are opposite to the surfaces exposed by separation or cleavage face the base substrate 307. In this embodiment mode, an insulating film 314 is formed over the base substrate 307. The insulating film 314 and the insulating film 320 are bonded to each other, whereby the semiconductor films 306 and the base substrate 307 can be bonded to each other. After bonding the insulating film 314 and the insulating film 320 to each other, heat treatment is preferably performed at 400° C. to 600° C. in order to further strengthen the bonding.

The semiconductor films 306 and the base substrate 307 are bonded to each other by van der Waals forces, so that they are firmly attached to each other even at room temperature. Note that since the above-described bonding can be performed at a low temperature, various substrates can be used as the base substrate 307. As the base substrate 307, for example, a glass substrate formed using aluminosilicate glass, barium borosilicate glass, aluminoborosilicate glass, or the like; a quartz substrate; a sapphire substrate; or the like can be used. Furthermore, as the base substrate 307, a semiconductor substrate formed using silicon, gallium arsenide, indium phosphide, or the like can be used. Alternatively, a metal substrate including a stainless steel substrate may be used as the base substrate 307.

Note that the insulating film 314 is not necessarily formed over the surface of the base substrate 307. Even when the insulating film 314 is not formed, the base substrate 307 and the insulating film 320 can be bonded to each other. Note that when the insulating film 314 is formed over the surface of the base substrate 307, it is possible to prevent impurities such as an alkali metal or an alkaline earth metal in the base substrate 307 from entering the semiconductor films 306.

When the insulating film 314 is formed, not the base substrate 307 but the insulating film 314 is bonded to the insulating film 320; therefore, more kinds of substrates can be used as the base substrate 307. A substrate made of a flexible synthetic resin such as plastic, generally tends to have a lower allowable temperature limit; however, when the insulating film 314 is formed, the substrate can be used as the base substrate 307 as long as it can withstand a processing temperature in a manufacturing process. As a plastic substrate, polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like can be used.

Note that before bonding the semiconductor films 306 to the base substrate 307, a surface of the insulating film 320 may be polished. Even when the surface of the insulating film 320 are damaged by the holding means 321 being in contact with the insulating film 320, the planarity of the surface of the insulating film 320 can be enhanced by polishing; therefore, the bonding strength can be secured.

Note that when MW-1 is used as a low-temperature coagulant, at a temperature at which a low-temperature coagulant does not have a bonding effect (for example, approximately at 25° C.), the low-temperature coagulant which is attached to the tip of the microneedle is brought into contact with the insulating film 320 on one of the projections 303. Next, the temperature is lowered to a temperature at which the low-temperature coagulant has a bonding effect (for example, approximately at 5° C.) to coagulate the low-temperature coagulant, whereby the insulating film 320 on one of the projections 303 and the microneedle are attached firmly to each other. Then, after bonding one of the semiconductor films 306 which is separated from the holding means 321 to the base substrate 307, the temperature is raised up again to a temperature at which the low-temperature coagulant does not have a bonding effect (for example, approximately at 25° C.), whereby the microneedle can be separated from the semiconductor film 306.

In FIG. 7C, a bond substrate having a crystal plane orientation different from that of the bond substrate 300 used for forming the semiconductor films 306 is prepared, and then the semiconductor film 308 is separated from the bond substrate in a similar manner to the semiconductor films 306 to be bonded to the base substrate 307.

The mobility of majority carriers in a semiconductor depends on crystal plane orientation. Accordingly, the bond substrate having a crystal plane orientation which is suitable for a semiconductor element to be formed may be selected as appropriate to form the semiconductor films 306 and the semiconductor film 308. For example, when an n-type semiconductor element is formed using one of the semiconductor films 306, the mobility of majority carriers in the semiconductor element can be increased by forming the semiconductor film 306 having a face {100}. Meanwhile, when a p-type semiconductor element is formed using the semiconductor film 308, the mobility of majority carriers in the semiconductor element can be increased by forming the semiconductor film 308 having a face {110}. When a transistor is formed as a semiconductor element, the bonding direction of the semiconductor films 306 or the semiconductor film 308 is set in consideration of the channel direction and the crystal plane orientation.

Note that as described above, the bond substrate 300 sometimes warps, bends, or has a little round edge. Moreover, in some cases, at the time of irradiating with hydrogen or a rare gas, or hydrogen ions or rare gas ions for separating a semiconductor film from the bond substrate 300, the gas or the ions cannot be added sufficiently at an edge of the bond substrate 300. Therefore, it is difficult to separate the semiconductor film at the edge of the bond substrate 300. When semiconductor films are formed by separating or cleaving the bond substrate after bonding the bond substrate to the base substrate, the distance between the semiconductor films is several millimeters to several centimeters. However, in the present invention, before bonding the bond substrate 300 to the base substrate 307, the bond substrate 300 is separated or cleaved to form the semiconductor films 306 and the semiconductor film 308. Accordingly, when the semiconductor films 306 and the semiconductor film 308 are bonded to the base substrate 307, the distance between each of the semiconductor films 306 and the semiconductor film 308 can be reduced to approximately several tens of micrometers. A semiconductor device can be manufactured easily without the influence of the space between each of the semiconductor films 306 and the semiconductor film 308.

Next, the surfaces of the semiconductor films 306 and the semiconductor film 308 may be planarized. Although not necessarily essential, the planarization makes it possible to improve characteristics of the interface between a gate insulating film, and semiconductor films 309 and a semiconductor film 310 which are to be formed later. Specifically, the planarization can be performed by chemical mechanical polishing (CMP), liquid jet polishing, or the like. The thicknesses of the semiconductor films 306 and the semiconductor film 308 are reduced by the planarization. The planarization may be performed on the semiconductor films 309 and the semiconductor film 310 formed by etching.

Figure 8A:
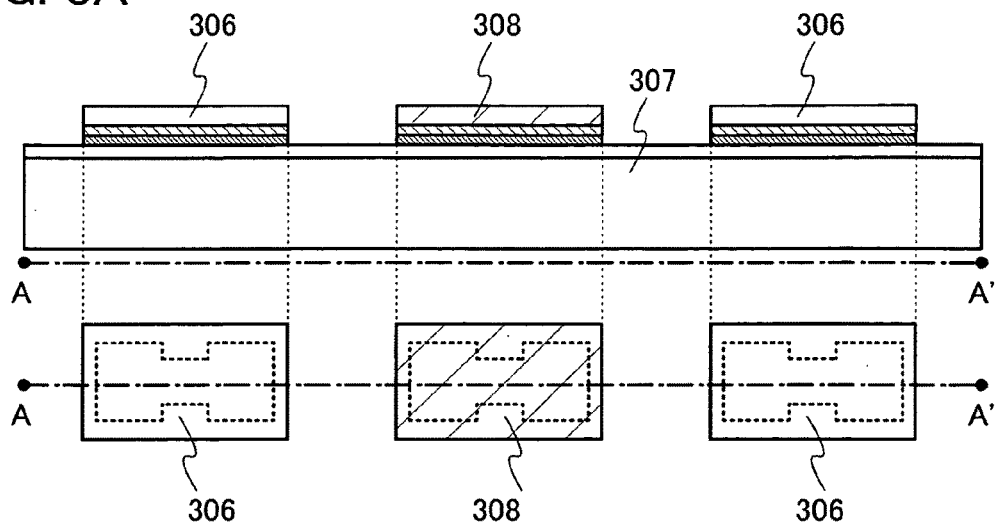
FIGS. 8A to 8C illustrate the manufacturing method of the semiconductor device of the present invention.

By the above-described manufacturing method, as illustrated in FIG. 8A, the semiconductor films 306 and the semiconductor film 308 can be formed over the base substrate 307. FIG. 8A illustrates a top view as well as a cross-sectional view of the semiconductor films 306 and the semiconductor film 308. The cross-sectional view illustrated in FIG. 8A corresponds to a cross section taken along a dashed line A-A' of the top view.

Figure 8B:
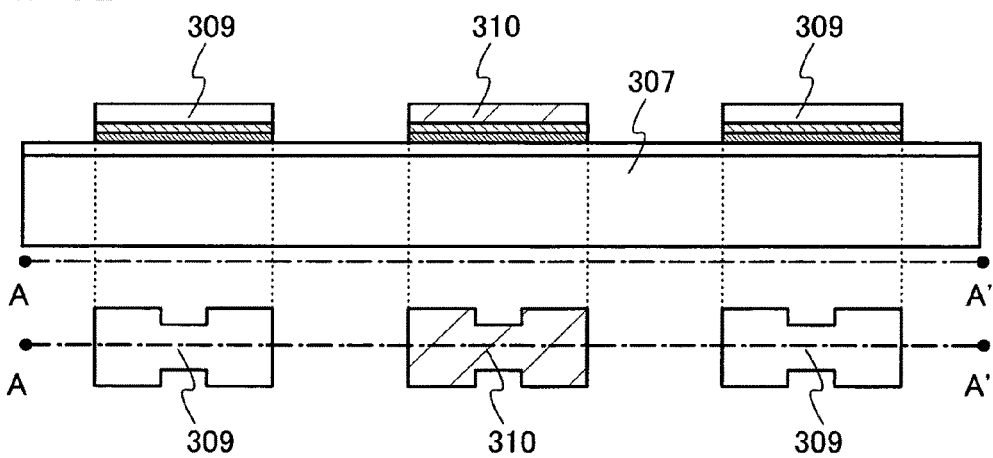

Next, as illustrated in FIG. 8B, the semiconductor films 306 and the semiconductor film 308 are partially etched, so that the semiconductor films 309 are formed using the semiconductor films 306 and the semiconductor film 310 is formed using the semiconductor film 308. FIG. 8B illustrates a top view as well as a cross-sectional view of the semiconductor films 309 and the semiconductor film 310. The cross-sectional view illustrated in FIG. 8B corresponds to a cross section taken along a dashed line A-A' of the top view. When the semiconductor films 306 and the semiconductor film 308 are further etched, the edges of the semiconductor films 306 and the semiconductor film 308 which do not have enough bonding strength can be removed.

Note that in this embodiment mode, one semiconductor film 306 is etched to form one semiconductor film 309, and one semiconductor film 308 is etched to form one semiconductor film 310; however, the present invention is not limited to this structure. For example, one semiconductor film 306 may be etched to form a plurality of semiconductor films 309, and one semiconductor film 308 may be etched to form a plurality of semiconductor films 310.

Note that the semiconductor films 309 and the semiconductor film 310, or the semiconductor films 306 and the semiconductor film 308 before etching may be irradiated with an energy beam to recover crystal defects. As the energy beam, a beam which is selectively absorbed in a semiconductor is used; for example, laser light is desirably used. As the laser light, a gas laser such as an excimer laser or a solid state laser such as a YAG laser can be used as a light source. The laser light preferably has a wavelength in the range of ultraviolet light to near-infrared light; specifically, laser light with a wavelength of 190 nm to 2000 nm is desirably used. Alternatively, flash lamp annealing which uses a halogen lamp, a xenon lamp, or the like may be performed to recover crystal defects.

Note that, although in this embodiment mode, the case of using a Smart Cut method in which the semiconductor films 306 and the semiconductor film 308 are separated from the bond substrate 300 by the formation of the defect layer 302 will be described, any other bonding method such as ELTRAN (epitaxial layer transfer), a dielectric isolation method, or a PACE (plasma assisted chemical etching) method may be used.

Figure 8C:
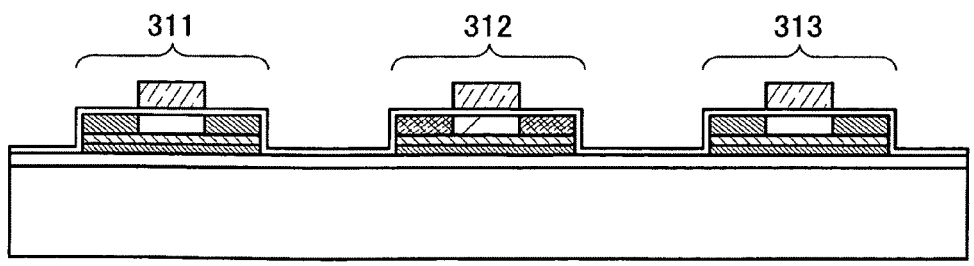

With the use of the semiconductor films 309 and the semiconductor film 310 which are formed through the above-described steps, as illustrated in FIG. 8C, various kinds of semiconductor elements such as transistors 311 to 313 can be formed.

Note that in this embodiment mode, the plurality of semiconductor films 306 are separated from the bond substrate 300 with the use of the holding means 321, and then the plurality of semiconductor films 306 are selected from the holding means 321 with the use of the collet 305; however, the present invention is not limited to this structure. With the use of the holding means 321 or the collet 305, after the plurality of semiconductor films 306 are separated from the bond substrate 300 all at once or one by one to be placed over a substrate having high planarity, the plurality of semiconductor films 306 may be reversed and selected by the collet 305 and then bonded to the base substrate.

In the manufacturing method of a semiconductor device of the present invention, a plurality of semiconductor films are bonded to one base substrate using the plurality of bond substrates 300; therefore, the large-sized base substrate 307 can be processed. Further, crystal plane orientation of a semiconductor film can be selected as appropriate in accordance with the polarity of a semiconductor element; therefore, the mobility of the semiconductor element can be increased, so that a semiconductor device capable of operating at a higher speed can be provided.

In the manufacturing method of a semiconductor device of the present invention, the bond substrate 300 is separated or cleaved at a plurality of portions, whereby the plurality of semiconductor films 306 can be formed and bonded to the base substrate; therefore, a position where each of the plurality of semiconductor films 306 is bonded can be selected in accordance with the polarity and the layout of the semiconductor element in the semiconductor device.

This embodiment mode can be implemented in combination with any of the above-described embodiment modes as appropriate.

Embodiment Mode 4

In this embodiment mode, a structure of a manufacturing apparatus of the present invention will be described.

Figure 9A:
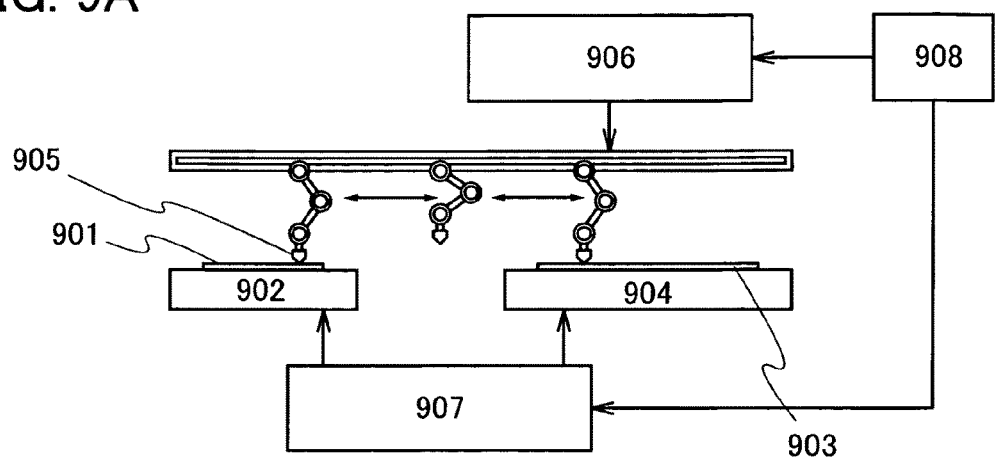
FIGS. 9A and 9B each illustrate a structure of a manufacturing apparatus of a semiconductor device of the present invention.

FIG. 9A illustrates an example of a structure of a manufacturing apparatus of the present invention. The manufacturing apparatus illustrated in FIG. 9A includes a stage 902 over which a bond substrate 901 is placed and a stage 904 over which a base substrate 903 is placed. Note that FIG. 9A illustrates an example in which each of the bond substrate 901 and the base substrate 903 is placed over a different stage; however, the present invention is not limited to this structure. The bond substrate 901 and the base substrate 903 can be placed over one stage.

Further, FIG. 9A illustrates only the stage 902 corresponding to one bond substrate 901; however, the present invention is not limited to this structure. For example, the manufacturing apparatus of the present invention may have a plurality of stages 902 corresponding to one bond substrate 901, or a plurality of bond substrates 901 may be placed over one stage 902.

Further, the manufacturing apparatus illustrated in FIG. 9A has a collet 905 which is firmly attached to a semiconductor film formed by separation or cleavage of the bond substrate 901 and which bonds the semiconductor film to a predetermined position of the base substrate 903. The collet 905 may be a means which can be firmly attached to a selected one of the semiconductor films, for example, a chuck such as a vacuum chuck or a mechanical chuck, a microneedle to the tip of which an adhesive is attached, or the like is used.

The manufacturing apparatus illustrated in FIG. 9A has at least a collet driving portion 906 which controls a position of the collet 905; a stage driving portion 907 which controls positions of the stage 902 and the stage 904; and a CPU 908 which controls the operation of the collet driving portion 906 and the stage driving portion 907 in accordance with positional information of the collet and the stages.

The positional information of the collet and the stages can be made based on positional information where a semiconductor film is formed in the bond substrate 901 and where the semiconductor film is bonded over the base substrate 903. Note that in order to adjust the position of the bond substrate 901 and the base substrate 903, a camera having an image pickup such as a charge coupled device (CCD) may be provided for the manufacturing apparatus illustrated in FIG. 9A.

Figure 9B:
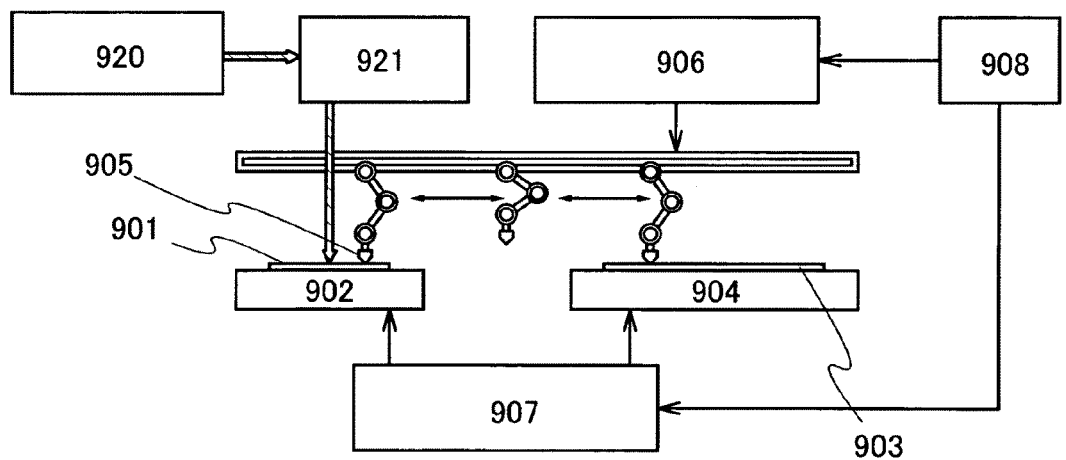

Next, FIG. 9B illustrates a structure of a manufacturing apparatus which can form a defect layer using laser light as an example.

A manufacturing apparatus illustrated in FIG. 9B has at least the stage 902 over which the bond substrate 901 is placed and the stage 904 over which the base substrate 903 is placed, the collet 905, the collet driving portion 906, the stage driving portion 907, and the CPU 908, similarly to the manufacturing apparatus illustrated in FIG. 9A. Further, the manufacturing apparatus illustrated in FIG. 9B has at least a laser oscillator 920 which oscillates laser light, and an optical system 921 which processes the laser light output from the laser oscillator 920.

The laser light output from the laser oscillator 920 is processed by the optical system 921, and then irradiated to the bond substrate 901. The laser light with which the bond substrate 901 is irradiated has such a high energy density as to generate multiphoton absorption in the bond substrate 901. The CPU 908 can control operation of the stage driving portion 907 in accordance with positional information of the defect layer and focus the laser light onto a desired position of the bond substrate 901. A defect layer is formed in the bond substrate 901 by laser light irradiation, and then heat treatment is performed on the bond substrate 901, whereby the bond substrate 901 is separated or cleaved at the defect layer, so that a plurality of semiconductor films can be formed.

As a laser which can be used for the laser oscillator 920, for example, a femtosecond laser typified by a titanium sapphire laser, a solid state laser such as a YAG laser, a $YVO_4$ laser which can shorten the pulse width to less than or equal to nanosecond or the like, can be used.

Figure 10:
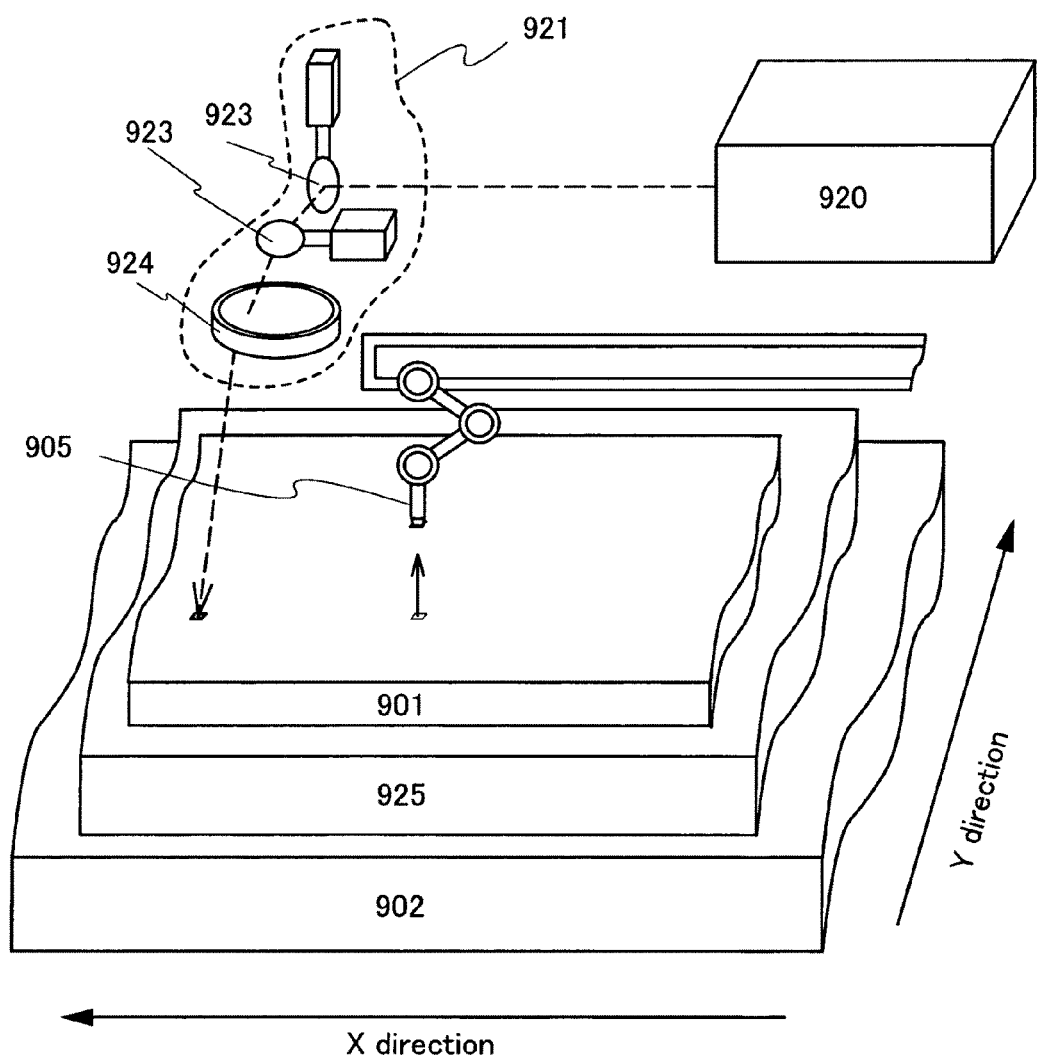
FIG. 10 illustrates a structure of the manufacturing apparatus of the semiconductor device of the present invention.

FIG. 10 illustrates a more specific structure of the optical system 921 and so on included in the manufacturing apparatus illustrated in FIG. 9B. In FIG. 10, galvanometer mirrors 923 and an f-θ lens 924 are used as the optical system 921. The direction of the laser light output from the laser oscillator 920 is adjusted by the plurality of galvanometer mirrors 923, and then the laser light is condensed by the f-θ lens 924 so as to have a focal point in the bond substrate 901.

Note that FIG. 10 illustrates an example in which a heat sink 925 for absorbing or diffusing heat of the bond substrate 901 is provided over the stage 902 and the bond substrate 901 is placed over the heat sink 925. In the manufacturing apparatus of the present invention, the heat sink 925 is not necessarily provided. Note that when a microneedle to the tip of which a low-temperature coagulant is attached is used as the collet 905, the temperature of the bond substrate 901 can be lowered effectively by using the heat sink 925.

In the manufacturing apparatuses of the present invention illustrated in FIGS. 9A and 9B, the plurality of semiconductor films which are formed using a plurality of bond substrates 901 can be transferred and bonded to desired positions of the base substrate 903 as appropriate.

In the manufacturing apparatus illustrated in FIG. 9B, while the bond substrate 901 is placed over the stage 902, two steps of laser light irradiation and selection of the plurality of semiconductor films with the collet 905 can be performed successively. Accordingly, in the two steps, positional alignment of the bond substrate 901 can be performed at one time, leading to easy positional alignment.

This embodiment mode can be implemented in combination with any of the above-described embodiment modes as appropriate.

Embodiment 1

Figure 11A:
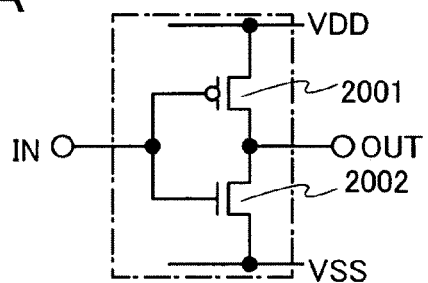
FIGS. 11A to 11D each illustrate a structure of an inverter formed by a manufacturing method of a semiconductor device of the present invention.

In this embodiment, a specific structure of various circuits included in the semiconductor device of the present invention will be described using an inverter as an example. FIG. 11A is an example of a circuit diagram of an inverter and FIG. 11D is an example of a top view of the inverter illustrated in FIG. 11A.

The inverter illustrated in FIG. 11A includes a p-channel transistor 2001 and an n-channel transistor 2002. The transistor 2001 and the transistor 2002 are connected in series. In specific, a drain of the transistor 2001 and a drain of the transistor 2002 are connected to each other. The drain potential of the transistor 2001 and the drain potential of the transistor 2002 are applied to an output terminal OUT.

A gate of the transistor 2001 and a gate of the transistor 2002 are connected to each other. A potential of a signal input to an input terminal IN is applied to the gate of the transistor 2001 and the gate of the transistor 2002. A high-level voltage VDD is applied to a source of the transistor 2001, and a low-level voltage VSS is applied to a source of the transistor 2002.

Figure 11B:
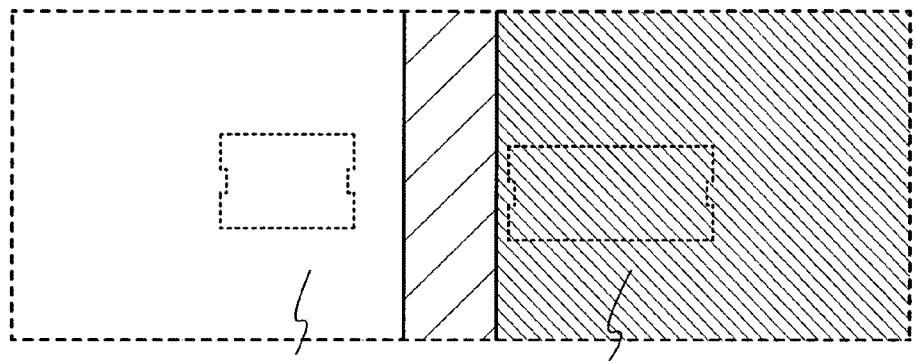
Figure 11C:
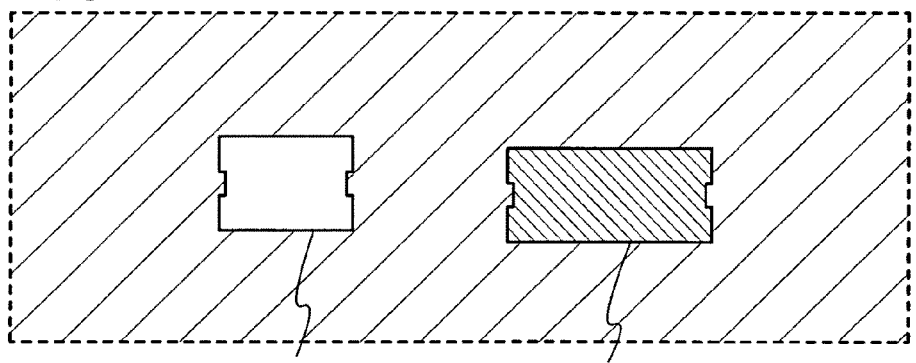
Figure 11D:
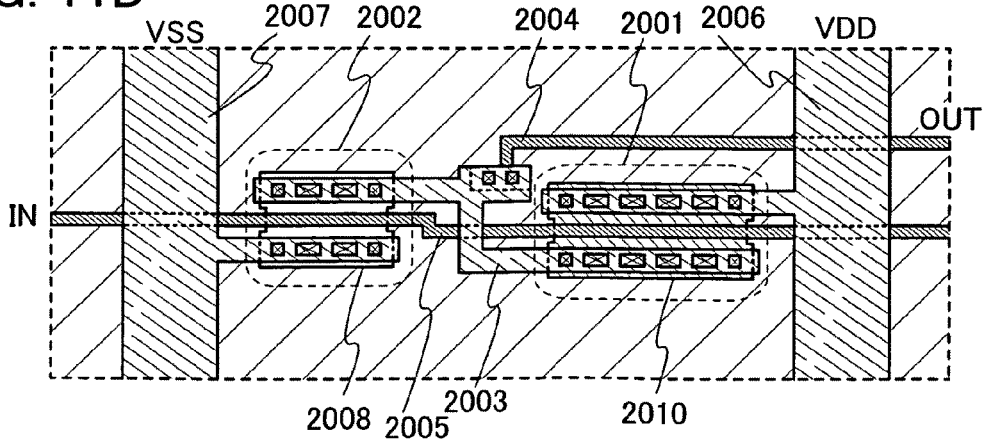

In order to form the inverter illustrated in FIG. 11A, in the manufacturing method of the present invention, a semiconductor film 2030 having a face {100} and a semiconductor film 2031 having a face {110} are bonded to the base substrate as illustrated in FIG. 11B. Next, as illustrated in FIG. 11C, the semiconductor film 2030 is partially etched to form a semiconductor film 2008, and the semiconductor film 2031 is partially etched to form a semiconductor film 2010.

Then, as illustrated in FIG. 11D, the n-channel transistor 2002 is formed using the semiconductor film 2008, and the p-channel transistor 2001 is formed using the semiconductor film 2010. Thus, the inverter can be formed.

Specifically, in the inverter illustrated in FIG. 11D, the drain of the transistor 2001 and the drain of the transistor 2002 are electrically connected to each other through a wiring 2003. The wiring 2003 is connected to a wiring 2004. Thus, potentials of the drain of the transistor 2001 and the drain of the transistor 2002 are applied as a potential of the output terminal OUT to a circuit in the next stage through the wirings 2003 and 2004.

Further, in the inverter illustrated in FIG. 11B, part of the wiring 2005 serves as the gate of the transistor 2001 and the gate of the transistor 2002. Thus, a potential applied to the wiring 2005 is applied as a potential of the input terminal IN to the gate of the transistor 2001 and the gate of the transistor 2002. The voltage VDD is applied to the source of the transistor 2001 through the wiring 2006, and the voltage VSS is applied to the source of the transistor 2002 through the wiring 2007.

This embodiment can be implemented in combination with any of the above-described embodiment modes as appropriate.

Embodiment 2

Figure 12A:
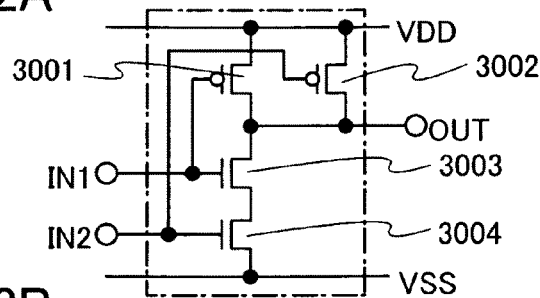
FIGS. 12A to 12D each illustrate a structure of a NAND circuit formed by a manufacturing method of a semiconductor device of the present invention.

In this embodiment, a specific structure of various circuits included in the semiconductor device of the present invention will be described using a NAND circuit as an example. FIG. 12A is an example of a circuit diagram of a NAND circuit and FIG. 12D is an example of a top view of the NAND circuit illustrated in FIG. 12A.

The NAND circuit illustrated in FIG. 12A includes a p-channel transistor 3001, a p-channel transistor 3002, an n-channel transistor 3003, and an n-channel transistor 3004. The transistors 3001, 3003, and 3004 are sequentially connected in series. The transistors 3001 and 3002 are connected in parallel.

In specific, a high-level voltage VDD is applied to one of a source and a drain of the transistor 3001, and the other of the source and the drain is connected to an output terminal OUT. The high-level voltage VDD is applied to one of a source and a drain of the transistor 3002, and the other of the source and the drain is connected to the output terminal OUT. A low-level voltage VSS is applied to one of a source and a drain of the transistor 3004. One of a source and a drain of the transistor 3003 is connected to the output terminal OUT. The other of the source and the drain of the transistor 3003 is connected to the other of the source and the drain of the transistor 3004. A potential of an input terminal IN1 is applied to a gate of the transistor 3001 and a gate of the transistor 3003. A potential of an input terminal IN2 is applied to a gate of the transistor 3002 and a gate of the transistor 3004.

Figure 12B:
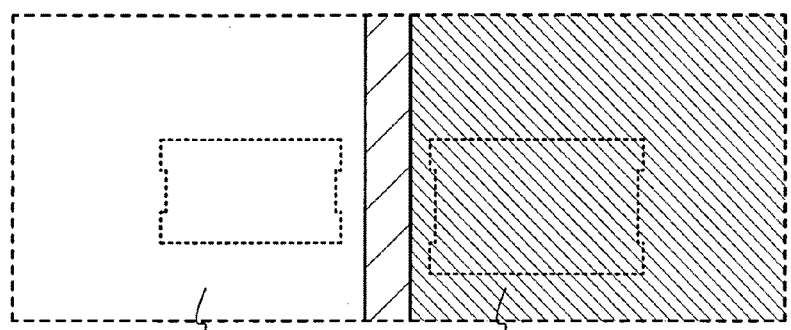
Figure 12C:
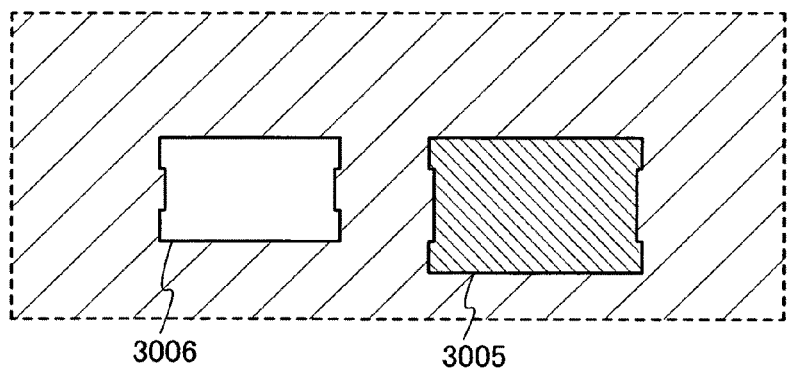
Figure 12D:
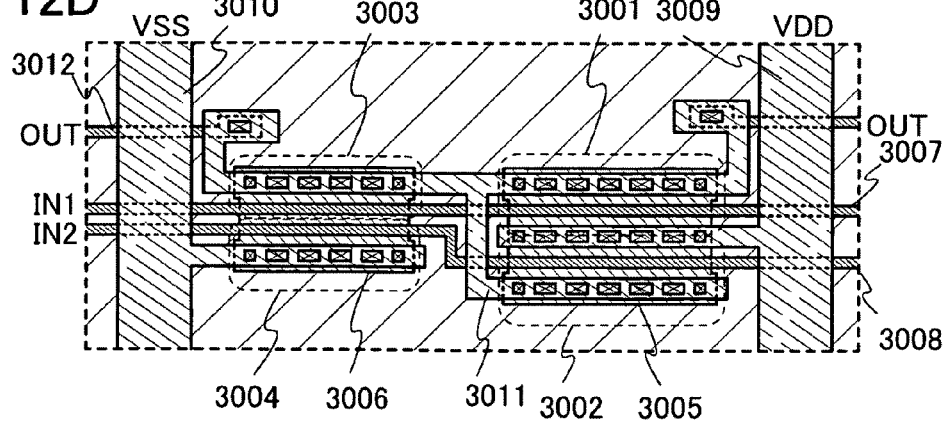

In order to form the NAND circuit illustrated in FIG. 12A, in a manufacturing method of the present invention, a semiconductor film 3030 having a face {100} and a semiconductor film 3031 having a face {110} are bonded to a base substrate as illustrated in FIG. 12B. Next, as illustrated in FIG. 12C, the semiconductor film 3030 is partially etched to form a semiconductor film 3006, and the semiconductor film 3031 is partially etched to form a semiconductor film 3005.

Then, as illustrated in FIG. 12D, an n-channel transistor 3003 and an n-channel transistor 3004 are formed using the semiconductor film 3006, and a p-channel transistor 3001 and a p-channel transistor 3002 are formed using the semiconductor film 3005, so that the NAND circuit can be formed.

In the NAND circuit illustrated in FIG. 12D, the transistors 3001 and 3002 connected in parallel share the semiconductor film 3005, and the transistors 3003 and 3004 connected in series share the semiconductor film 3006. Part of a wiring 3007 serves as the gate of the transistor 3001 and the gate of the transistor 3003. Thus, a potential applied to the wiring 3007 is applied as a potential of the input terminal IN1 to the gate of the transistor 3001 and the gate of the transistor 3003. Part of a wiring 3008 serves as the gate of the transistor 3002 and the gate of the transistor 3004. Thus, a potential applied to the wiring 3008 is applied as a potential of the input terminal IN2 to the gate of the transistor 3002 and the gate of the transistor 3004.

The high-level voltage VDD is applied to one of the source and the drain of the transistor 3001 and one of the source and the drain of the transistor 3002 through a wiring 3009. The low-level voltage VSS is applied to one of the source and the drain of the transistor 3004 through a wiring 3010. Potentials of the other of the source and the drain of the transistor 3001, the other of the source and the drain of the transistor 3002, and one of the source and the drain of the transistor 3003 are applied as a potential of the output terminal OUT to a circuit in the next stage through wirings 3011 and 3012.

This embodiment can be implemented in combination with any of the above-described embodiment modes and embodiment as appropriate.

Embodiment 3

In this embodiment, a specific example of a manufacturing method of a transistor used in the present invention will be described.

Figure 13A:
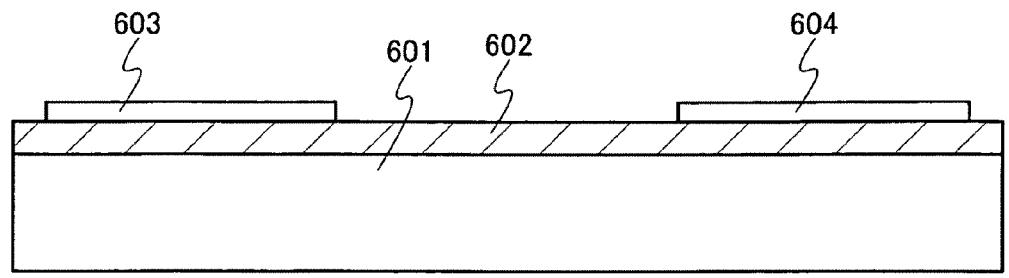
FIGS. 13A to 13D illustrate a manufacturing method of a semiconductor device of the present invention.

First, as illustrated in FIG. 13A, a semiconductor film 603 having a face {100} and a semiconductor film 604 having a face {110} are formed over a base substrate 601. In this embodiment, a case where an insulating film 602 is provided between the base substrate 601 and the semiconductor films 603 and 604 is exemplified. The insulating film may be either a single insulating film or a plurality of stacked insulating films.

An impurity may be added to the semiconductor film 603 and the semiconductor film 604 in order to control the threshold voltage. For example, in the case of adding boron as an impurity imparting p-type conductivity, boron is preferably added at a concentration of greater than or equal to $5 \times 10^{17}$ cm$^{-3}$ and less than or equal to $1 \times 10^{18}$ cm$^{-3}$. The addition of the impurity for controlling the threshold voltage may be performed before or after the semiconductor films are bonded to the base substrate 601.

Hydrogenation may be performed after the semiconductor film 603 and the semiconductor film 604 are formed and before gate insulating films 606 are formed. The hydrogenation is performed, for example, at 350° C. in a hydrogen atmosphere for approximately two hours.

Figure 13B:
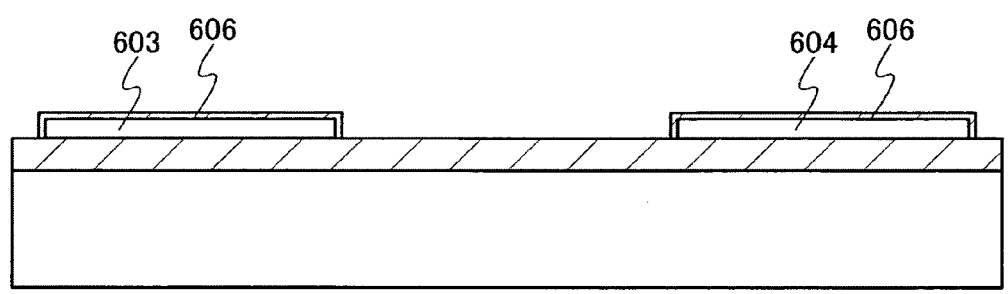

Next, as illustrated in FIG. 13B, the gate insulating films 606 are formed so as to cover the semiconductor film 603 and the semiconductor film 604. The gate insulating films 606 can be formed by oxidation or nitridation of surfaces of the semiconductor film 603 and the semiconductor film 604 by high-density plasma treatment. High-density plasma treatment is performed using, for example, a mixed gas of a rare gas such as He, Ar, Kr, or Xe and oxygen, nitrogen oxide, ammonia, nitrogen, hydrogen, or the like. In this case, when plasma is excited by introduction of microwaves, plasma with a low electron temperature and high density can be generated. The surfaces of the semiconductor films are oxidized or nitrided by oxygen radicals (OH radicals may be included) or nitrogen radicals (NH radicals may be included) which are generated by such high-density plasma, whereby insulating films each having a thickness of 1 nm to 20 nm, desirably 5 nm to 10 nm are formed so as to be in contact with the semiconductor films. The insulating films with a thickness of 5 nm to 10 nm are used as the gate insulating films 606.

Since the oxidation or nitridation of the semiconductor films by the above-described high-density plasma treatment progresses under a solid-state reaction, interface state density between the gate insulating films 606 and each of the semiconductor film 603 and the semiconductor film 604 can be extremely low. In addition, the semiconductor films are directly oxidized or nitrided by the high-density plasma treatment, whereby variation in the thickness of the insulating films which are to be formed can be suppressed. Moreover, when the semiconductor films have crystallinity, the surfaces of the semiconductor films are oxidized by a solid-state reaction using the high-density plasma treatment, whereby rapid oxidation only in crystal grain boundaries can be prevented and the gate insulating film with good uniformity and low interface state density can be formed. When the insulating film formed by the high-density plasma treatment is used as in part of the gate insulating film or the whole gate insulating film of a transistor, variation in the characteristics of the transistor can be suppressed.

Alternatively, the gate insulating films 606 may be formed by thermally oxidizing the semiconductor film 603 and the semiconductor film 604. The gate insulating films 606 may also be formed as a single layer or a stacked layers of a film containing silicon oxide, silicon nitride oxide, silicon oxynitride, silicon nitride, hafnium oxide, aluminum oxide, and/or tantalum oxide by plasma CVD, sputtering, or the like.

Figure 13C:
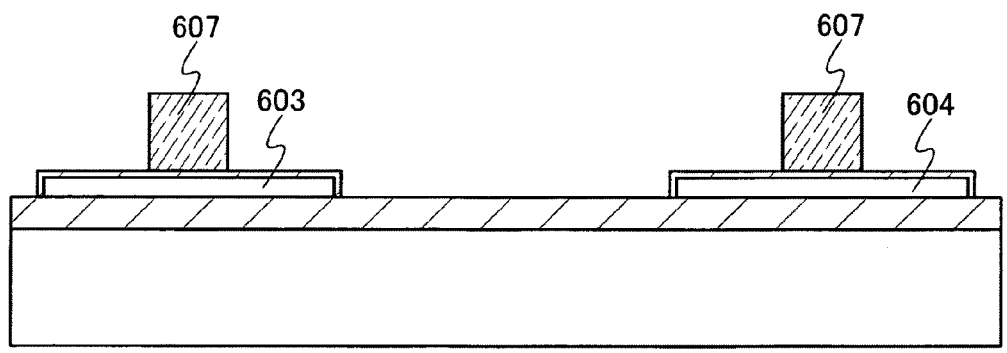

Next, as illustrated in FIG. 13C, conductive films are formed over the gate insulating films 606, and then the conductive films are processed (patterned) into a predetermined shape, whereby electrodes 607 are formed over the semiconductor film 603 and the semiconductor film 604. A CVD method, a sputtering method, or the like can be used for forming the conductive films. Tantalum (Ta), tungsten (W), titanium (Ti), molybdenum (Mo), aluminum (Al), copper (Cu), chromium (Cr), niobium (Nb), or the like can be used for forming the conductive films. Alternatively, an alloy containing the above-described metal as its main component or a compound containing as the above-described metal may be used. Further alternatively, the conductive films may be formed using a semiconductor such as polycrystalline silicon which is formed by doping a semiconductor film with an impurity element imparting a conductivity type, such as phosphorus.

In the case of using two conductive films, tantalum nitride or tantalum (Ta) can be used for a first layer, and tungsten (W) can be used for a second layer. Besides the above-described example, tungsten nitride and tungsten; molybdenum nitride and molybdenum; aluminum and tantalum; aluminum and titanium; and the like can be given. Since tungsten and tantalum nitride have high thermal resistance, heat treatment for thermal activation can be performed after the first conductive film and the second conductive film are formed. As a combination of the two conductive films, for example, silicon doped with an impurity imparting n-type conductivity and nickel silicide; silicon doped with an impurity imparting n-type conductivity and WSi$_x$; or the like can be used.

In addition, although each of the electrodes 607 is formed of a single-layer conductive film in this embodiment, this embodiment is not limited to this structure. Each of the electrodes 607 may be formed of a plurality of stacked conductive films. In the case of a multi-layer structure in which three or more conductive films are stacked, a stacked structure including a molybdenum film, an aluminum film, and a molybdenum film may be used.

As masks used for forming the electrodes 607, instead of resist, silicon oxide, silicon oxynitride, silicon nitride oxide, or the like may be used. Although, in this case, a step of forming the mask using silicon oxide, silicon oxynitride, silicon nitride oxide, or the like by patterning is added, since film reduction of the mask at the time of etching is less than that in the case of using a resist mask, the electrodes 607 with desired widths can be formed. Alternatively, the electrodes 607 may be selectively formed by a droplet discharging method without using the mask.

Note that a droplet discharging method refers to a method in which droplets containing a predetermined composition are discharged or ejected from a pore to form a predetermined pattern, and an ink-jet method or the like is included in the category.

The electrodes 607 with desired tapered shapes can be obtained by etching the conductive films by ICP (inductively coupled plasma) etching while appropriately controlling the etching conditions (e.g., the amount of electric power applied to a coiled electrode layer, the amount of electric power applied to an electrode layer on the substrate side, and the electrode temperature on the substrate side). The angle and the like of the tapered shape can be controlled also by a mask shape. Note that as an etching gas, a chlorine-based gas such as chlorine, boron chloride, silicon chloride, or carbon tetrachloride; a fluorine-based gas such as carbon tetrafluoride, sulfur tetrafluoride, or nitrogen fluoride; or oxygen can be used as appropriate.

Figure 13D:
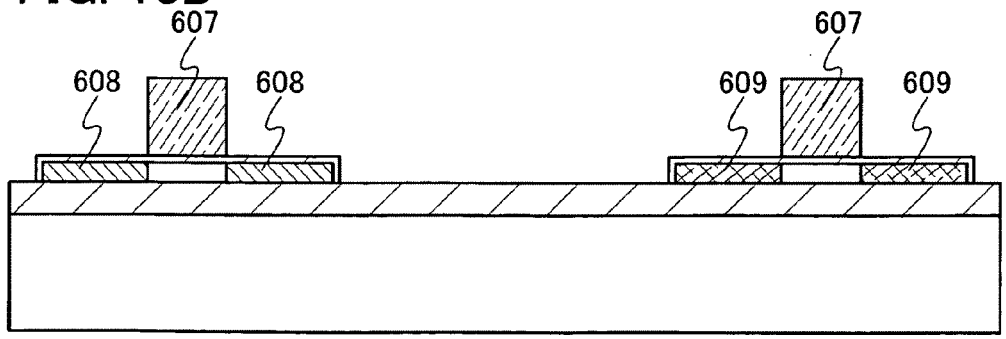

Next, as illustrated in FIG. 13D, an impurity element imparting one conductivity type is added to the semiconductor film 603 and the semiconductor film 604 with the use of the electrodes 607 as masks. In this embodiment mode, an impurity element imparting p-type conductivity (e.g., boron) is added to the semiconductor film 604, and an impurity element imparting n-type conductivity (e.g., phosphorus or arsenic) is added to the semiconductor film 603. Note that when the impurity element imparting p-type conductivity is added to the semiconductor film 604, the semiconductor film 603 to which the n-type impurity is added is covered with a mask or the like so that the addition of the impurity element imparting p-type conductivity can be performed selectively. On the other hand, when the impurity element imparting n-type conductivity is added to the semiconductor film 603, the semiconductor film 604 to which the p-type impurity is added is covered with a mask or the like so that the addition of the impurity element imparting n-type conductivity can be performed selectively. Alternatively, after adding an impurity element imparting one of p-type and n-type conductivity to the semiconductor films 603 and 604, an impurity element imparting the other of p-type and n-type conductivity may be added to one of the semiconductor films 603 and 604 selectively at higher concentration than the previously added impurity. By the above-described addition of the impurity element, impurity regions 608 and impurity regions 609 are formed in the semiconductor film 603 and the semiconductor film 604, respectively.

Figure 14A:
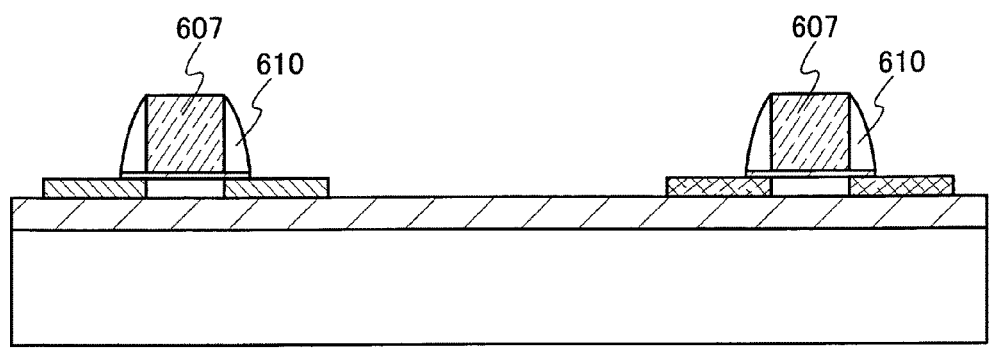
FIGS. 14A to 14C illustrate the manufacturing method of the semiconductor device of the present invention.

Next, as illustrated in FIG. 14A, sidewalls 610 are formed on side surfaces of each of the electrodes 607. For example, the sidewalls 610 can be formed in such a manner that another insulating film is formed so as to cover the gate insulating film 606 and the electrode 607, and the newly-formed insulating film is partially etched by anisotropic etching performed mainly in a perpendicular direction. The newly-formed insulating film is partially etched by the above-described anisotropic etching, whereby the sidewalls 610 are formed on the side surfaces of each of the electrodes 607. Note that the gate insulating films 606 may be partially etched by the above-described anisotropic etching. The insulating film for forming the sidewalls 610 may be formed by plasma CVD, sputtering, or the like as a single layer or stacked layers of a silicon film, a silicon oxide film, a silicon oxynitride film, or a silicon nitride oxide film, or a film containing an organic material such as an organic resin. In this embodiment, a silicon oxide film is formed by plasma CVD to have a thickness of 100 nm. In addition, as an etching gas, a mixed gas of $CHF_3$ and helium can be used. Note that the steps of forming the sidewalls 610 are not limited to these steps.

Figure 14B:
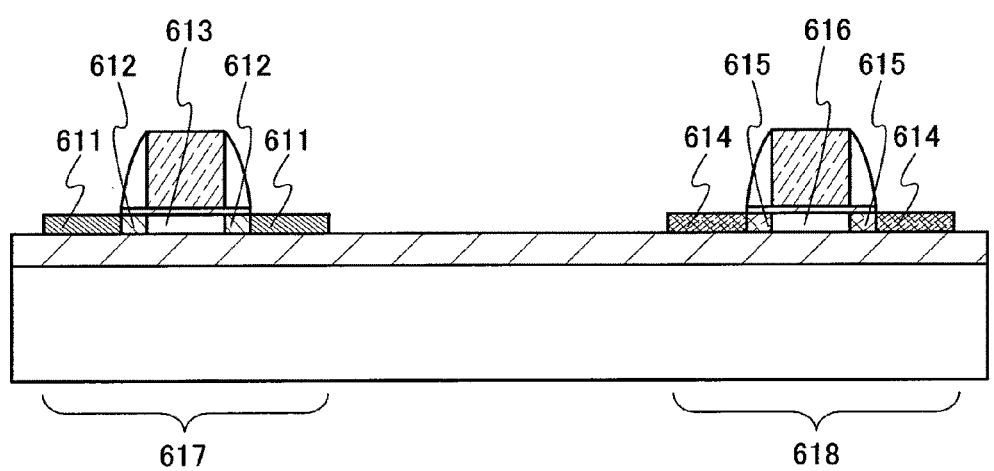

Next, as illustrated in FIG. 14B, an impurity element imparting one conductivity type is added to the semiconductor film 603 and the semiconductor film 604 with the use of the electrodes 607 and the sidewalls 610 as masks. Note that the impurity elements imparting the same conductivity type as the impurity elements which have been added to the semiconductor film 603 and the semiconductor film 604 in the previous step are added to the semiconductor film 603 and the semiconductor film 604 at higher concentration than in the previous step. Note that when the impurity element imparting p-type conductivity is added to the semiconductor film 604, the semiconductor film 603 to which the n-type impurity is added is covered with a mask or the like so that the addition of the impurity element imparting p-type conductivity can be performed selectively. On the other hand, when the impurity element imparting n-type conductivity is added to the semiconductor film 603, the semiconductor film 604 to which the p-type impurity element is added is covered with a mask or the like so that the addition of the impurity element imparting n-type conductivity can be performed selectively.

By the above-descried addition of the impurity element, a pair of high concentration impurity regions 611, a pair of low concentration impurity regions 612, and a channel formation region 613 are formed in the semiconductor film 603. In addition, by the above-described addition of the impurity element, a pair of high concentration impurity regions 614, a pair of low concentration impurity regions 615, and a channel formation region 616 are formed in the semiconductor film 604. Each of the high concentration impurity regions 611 and 614 functions as a source and a drain, and the low concentration impurity regions 612 and 615 function as LDD (lightly doped drain) regions.

Note that the sidewalls 610 formed over the semiconductor film 604 and the sidewalls 610 formed over the semiconductor film 603 may be formed so as to have the same width in the carrier flow direction, or may be formed so as to have different widths. It is preferable that the width of the sidewall 610 over the semiconductor film 604 which constitutes a part of a p-type transistor be larger than the width of the sidewall 610 over the semiconductor film 603 which constitutes a part of an n-type transistor. This is because boron which is added for forming a source and a drain in the p-type transistor is easily diffused and a short-channel effect is easily induced. When the width of the sidewall 610 in the p-type transistor is made larger than that of the sidewall 610 in the n-channel transistor, boron can be added to the source and the drain at high concentration, and thus the resistance of the source and the drain can be reduced.

Next, a silicide layer may be formed by silicification of the semiconductor film 603 and the semiconductor film 604 in order to further reduce the resistance of the source and the drain. The silicification is performed in such a manner that the a metal is brought into contact with the semiconductor film, and silicon in the semiconductor film is made to react with the metal by heat treatment, a GRTA method, an LRTA method, or the like. Cobalt silicide or nickel silicide may be used for the silicide layer. When the thicknesses of the semiconductor film 603 and the semiconductor film 604 are small, the silicide reaction may proceed to the bottom of the semiconductor film 603 and the semiconductor film 604 in this region. As a metal material used for the silicification, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Alternatively, silicide may be formed by laser irradiation or light irradiation using a lamp or the like.

Through the above-described series of steps, an n-channel transistor 617 and a p-channel transistor 618 are manufactured. Note that in a p-type semiconductor, holes that are majority carriers have the highest mobility on the {110} crystal orientation, whereas in an n-type semiconductor, electrons that are majority carriers have the highest mobility on the {100} crystal orientation. In the present invention, crystal plane orientation of a semiconductor film can be selected as appropriate in accordance with the polarity of a semiconductor element; therefore, the mobility of the semiconductor element can be increased and a semiconductor device capable of operating at a higher speed can be provided.

Figure 14C:
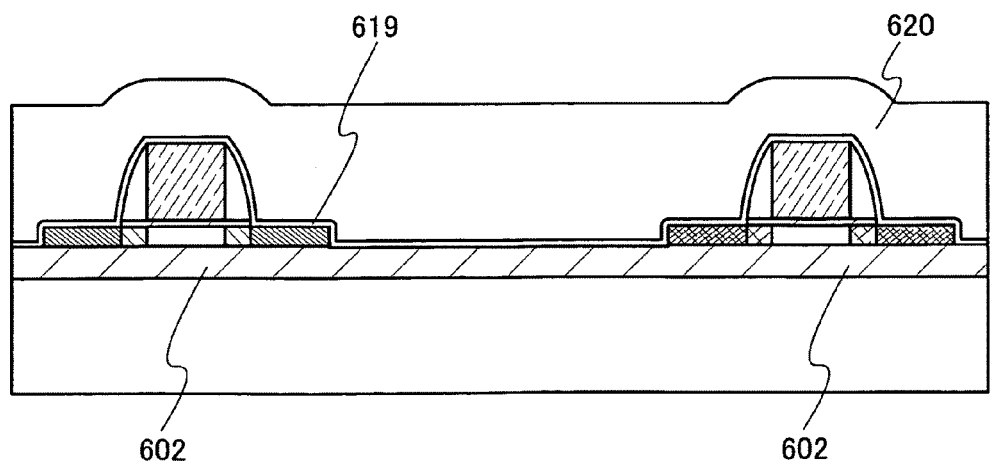

Next, as illustrated in FIG. 14C, an insulating film 619 is formed so as to cover the transistors 617 and 618. Although the insulating film 619 is not necessarily provided, the provision of the insulating film 619 makes it possible to prevent impurities such as an alkali metal or an alkaline earth metal from entering the transistors 617 and 618. Specifically, it is desirable to use silicon nitride, silicon nitride oxide, aluminum nitride, aluminum oxide, silicon oxynitride, silicon oxide, or the like for the insulating film 619. In this embodiment mode, a silicon nitride oxide film with a thickness of approximately 600 nm is used as the insulating film 619. In this case, the above-described hydrogenation step may be performed after the formation of the silicon nitride oxide film.

Subsequently, an insulating film 620 is formed over the insulating film 619 so as to cover the transistors 617 and 618. The insulating film 620 can be formed using a heat-resistant organic material such as polyimide, acrylic, benzocyclobutene, polyamide, or epoxy. As an alternative to the above organic material, a material with a low dielectric constant (a low-k material), a siloxane-based resin, silicon oxide, silicon nitride, silicon oxynitride, silicon nitride oxide, PSG (phosphosilicate glass), BPSG (borophosphosilicate glass), alumina, or the like can be used. A siloxane-based resin may have, as its substituent, at least one of fluorine, an alkyl group, and an aromatic hydrocarbon in addition to hydrogen. Alternatively, the insulating film 620 may be formed by stacking plural insulating films formed using these materials. The insulating film 620 may have its surface planarized by a CMP method, or the like.

In a case where the semiconductor film 603 and the semiconductor film 604 are bonded to the base substrate 601 by the method described in Embodiment Mode 3, the insulating films which are separated from each other exist between the base substrate 601, and the semiconductor film 603 and the semiconductor film 604. However, when the insulating film 620 is formed by a coating method with the use of, for example, the aforementioned polyimide, siloxane-based resin, or the like, it is possible to prevent the surface of the insulating film 620 from becoming uneven even if there is a difference in level between the insulating films which are separated from each other. Accordingly a surface which is less uneven than the surfaces of the insulating films is formed over the insulating film 620, whereby it is possible to prevent part of conductive films 621 and conductive films 622 which are later formed over the insulating film 620 from being drastically thinned or, in the worst case, being disconnected. Accordingly, the formation of the insulating film 620 by a coating method can eventually increase the yield and reliability of the semiconductor device formed by applying the present invention.

The siloxane-based resin corresponds to a resin including a Si—O—Si bond formed by starting from a siloxane-based material. The siloxane-based resin may have, as its substituent, at least one of fluorine, an alkyl group, and an aromatic hydrocarbon in addition to hydrogen.

The insulating film 620 can be formed by a CVD method, a sputtering method, an SOG method, spin coating, dipping, spray coating, a droplet discharging method (an inkjet method, screen printing, offset printing, or the like), a doctor knife, a roll coater, a curtain coater, a knife coater, or the like depending on the material.

Figure 15:
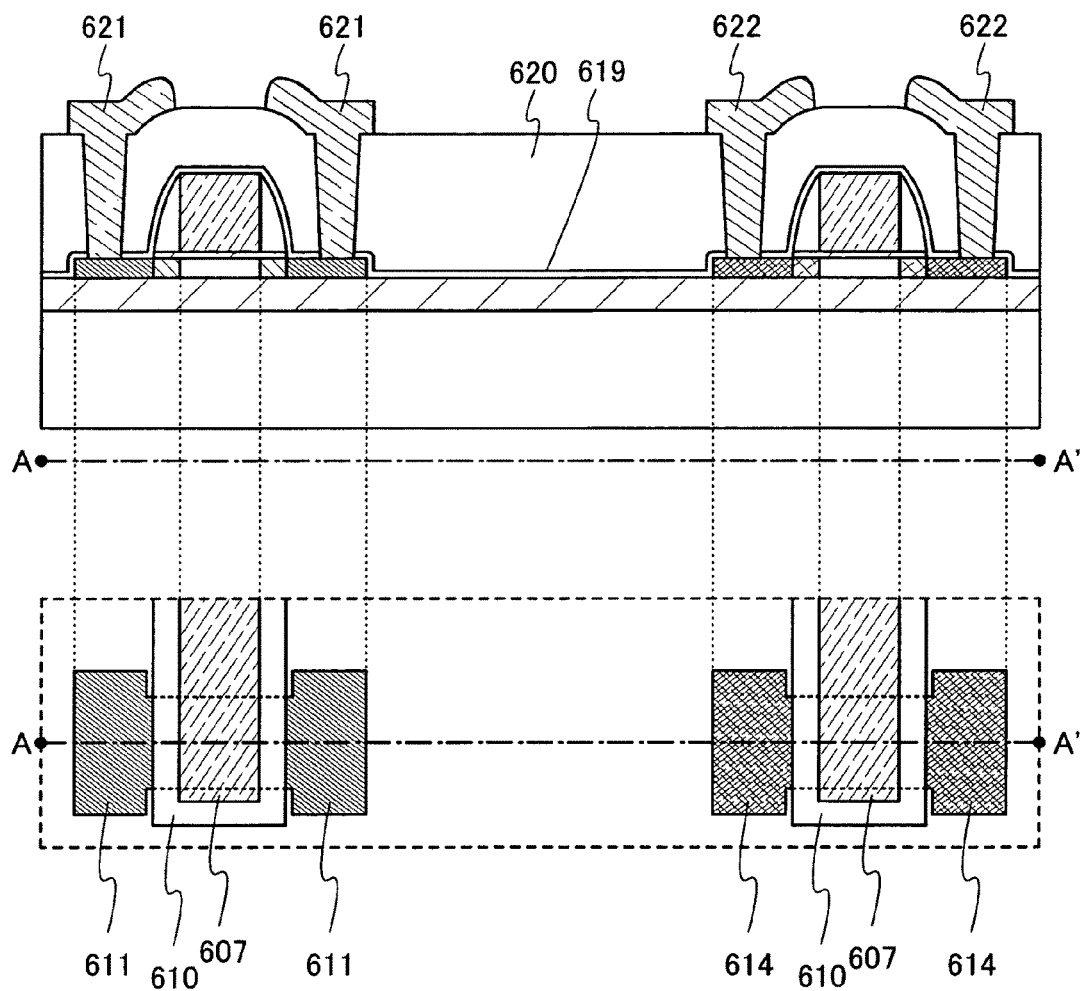
FIG. 15 illustrates the manufacturing method of the semiconductor device of the present invention.

Subsequently, as illustrated in FIG. 15, contact holes are formed in the insulating film 619 and the insulating film 620 so as to partially expose the semiconductor film 603 and the semiconductor film 604. Then, conductive films 621 and conductive films 622 are formed, which are in contact with the semiconductor film 603 and the semiconductor film 604 through the contact holes, respectively. The contact holes are formed by etching with the use of a mixed gas of $CHF_3$ and He; however, the present invention is not limited thereto.

The conductive films 621 and the conductive films 622 can be formed by a CVD method, a sputtering method, or the like. In specific, the conductive films 621 and the conductive films 622 can be formed using aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing any of the aforementioned metals as its main component or a compound containing any of the aforementioned metals may be used. The conductive films 621 and the conductive films 622 can be formed as a single layer or a plurality of stacked layers by using a film formed of any of the aforementioned metals.

As an example of an alloy containing aluminum as its main component, an alloy containing aluminum as its main component and also containing nickel is given. Moreover, an alloy containing aluminum as its main component and also containing nickel and one or both of carbon and silicon can be given as another example. Since aluminum and aluminum silicon have low resistance and are inexpensive, they are suitable for forming the conductive films 621 and the conductive films 622. In comparison to an aluminum film, an aluminum silicon (Al—Si) film can particularly prevent the generation of hillock at resist baking at the time of patterning the conductive films 621 and the conductive films 622. The aluminum film may include about 0.5 wt. % of copper instead of silicon.

Each of the conductive films 621 and the conductive films 622 preferably employs a stacked-layer structure of a barrier film, an aluminum silicon (Al—Si) film, and a barrier film, or a stacked layer structure of a barrier film, an aluminum silicon (Al—Si) film, a titanium nitride film, and a barrier film. The barrier film is formed using titanium, a nitride of titanium, molybdenum, or a nitride of molybdenum. When the barrier films are formed so that the aluminum silicon (Al—Si) film is interposed therebetween, the generation of hillock of aluminum or aluminum silicon can be prevented further. Even if a thin oxide film is formed over the semiconductor film 603 and the semiconductor film 604, when the barrier films are formed by using titanium, which is an element with a high reduction property, the oxide film is reduced by titanium in the barrier films. As a result, the conductive films 621 and the conductive films 622 can have favorable contact with the semiconductor film 603 and the semiconductor film 604, respectively. The plurality of barrier films may be stacked. In that case, for example, each of the conductive films 621 and the conductive films 622 can be formed to have a five-layer structure of titanium, titanium nitride, aluminum silicon, titanium, and titanium nitride in order from the bottom layer.

Note that the conductive films 621 are connected to the high-concentration impurity regions 611 of the n-channel transistor 617. The conductive films 622 are connected to the high-concentration impurity regions 614 of the p-channel transistor 618.

Lower part of FIG. 15 is a top view of the n-channel transistor 617 and the p-channel transistor 618. However, the conductive films 621, the conductive films 622, the insulating film 619, and the insulating film 620 are omitted in the top view of FIG. 15.

Although in this embodiment, the case where each of the n-channel transistor 617 and the p-channel transistor 618 has one electrode 607 serving as a gate is described, the present invention is not limited to this structure. The transistors manufactured by the present invention may each have a multigate structure having plural electrodes which function as gates and which are electrically connected to each other.

The transistors in the semiconductor device manufactured by the present invention may each have a gate-planar structure.

This embodiment can be implemented in combination with any of the above-described embodiment modes as appropriate.

Embodiment 4

Figure 16A:
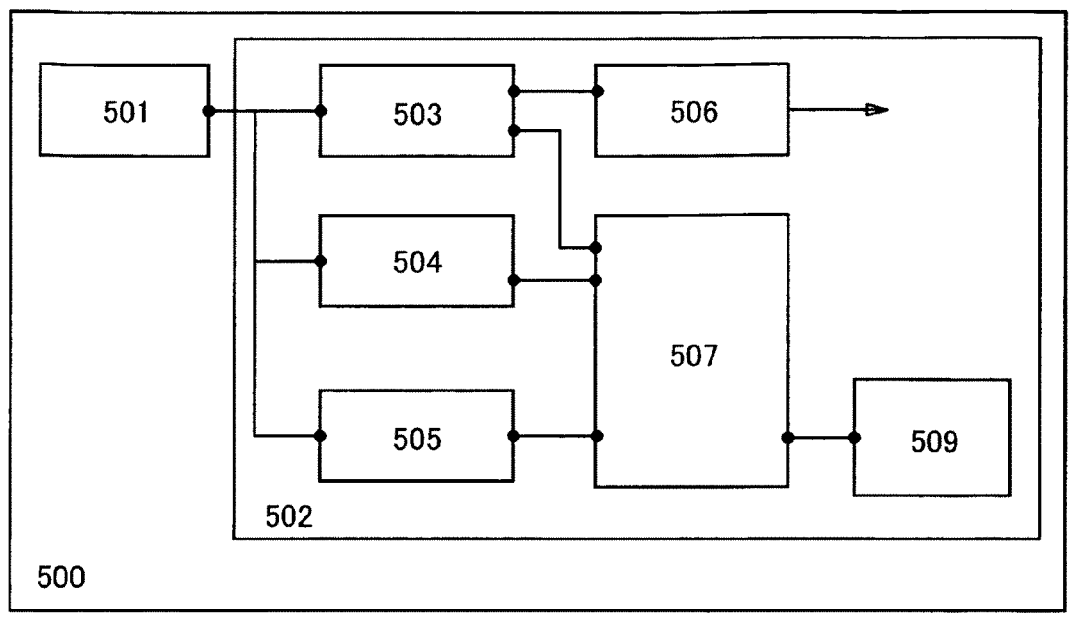
FIGS. 16A and 16B each illustrate a structure of a semiconductor device formed by a manufacturing method of the present invention.

In this embodiment, a structure of an RF tag which is one of semiconductor devices of the present invention will be described. FIG. 16A is a block diagram illustrating one mode of the RF tag of the present invention. In FIG. 16A, an RF tag 500 has an antenna 501 and an integrated circuit 502. The integrated circuit 502 has a power supply circuit 503, a demodulation circuit 504, a modulation circuit 505, a regulator 506, a control circuit 507, and a memory 509. The integrated circuit 502 can be formed using the semiconductor films obtained by the present invention.

When radio waves are transmitted from an interrogator, the radio waves are converted into an AC voltage in the antenna 501. In the power supply circuit 503, the AC voltage from the antenna 501 is rectified to generate a voltage for a power supply. The voltage for a power supply, which is generated in the power supply circuit 503, is fed to the control circuit 507 and the regulator 506. After stabilizing the voltage for a power supply from the power supply circuit 503 or after adjusting the level thereof, the regulator 506 supplies the voltage to circuits such as the demodulation circuit 504, the modulation circuit 505, the control circuit 507, or the memory 509 in the integrated circuit 502.

The demodulation circuit 504 demodulates the AC signal received by the antenna 501 to output the signal to the control circuit 507 of the next stage. The control circuit 507 performs arithmetic processing in accordance with the signal input from the demodulation circuit 504 and generates a new signal. When the arithmetic processing is performed, the memory 509 can be used as a primary cache memory or a secondary cache memory. Further, the control circuit 507 analyses the signal input from the demodulation circuit 504, and data in the memory 509 is output or the content of an instruction in the memory 509 is stored in accordance with the content of an instruction transmitted from the interrogator. The signal output from the control circuit 507 is encoded and transmitted to the modulation circuit 505. The modulation circuit 505 modulates the radio waves received by the antenna 501 in accordance with the signal. The radio waves modulated in the antenna 501 is received by the interrogator. Then, data output from the RF tag 500 can be obtained.

Thus, communication between the RF tag 500 and the interrogator can be performed by modulating radio waves used as a carrier (carrier wave). The frequency of the carrier wave is 125 kHz, 13.56 MHz, 950 MHz, or the like, which varies depending on the standard. A modulation method includes various methods such as amplitude modulation, frequency modulation, and phase modulation, depending on the standard; however, any modulation method may be employed as long as it is based on the standard.

A signal transmission method can be categorized into various methods such as an electromagnetic coupling method, an electromagnetic induction method, a microwave method, and the like depending on the wavelength of a carrier.

The memory 509 may be either a nonvolatile memory or a volatile memory. As the memory 509, an SRAM, a DRAM, a flash memory, an EEPROM, an FeRAM or the like can be used, for example.

In this embodiment, a structure of the RF tag 500 having the antenna 501 is described; however, the RF tag of the present invention does not necessarily include an antenna. In addition, the RF tag illustrated in FIG. 16A may be provided with an oscillation circuit or a secondary battery.

In FIG. 16A, a structure of the RF tag including only one antenna is described; however, the present invention is not limited to this structure. The RF tag may have two antennas, that is, an antenna for receiving power and an antenna for receiving a signal. If the RF tag has one antenna, in the case where both supply of power and transmission of a signal are performed with radio waves of 950 MHz for example, a large amount of power might be transmitted to a distance to impede the reception of other wireless devices. Therefore, it is desirable that power be supplied over a short distance using radio waves with reduced frequency; however, a communication distance is inevitably short in this case. On the other hand, if the RF tag includes two antennas, the frequency of radio waves for supplying power and the frequency of radio waves for transmitting a signal can be separately used. For example, in the case of transmitting power, electromagnetic induction using radio waves with a frequency of 13.56 MHz can be used, and in the case of transmitting a signal, a radio frequency method using radio waves with a frequency of 950 MHz can be used. By thus separately using antennas depending on functions, power can be supplied for communication only over a short distance and a signal can be transmitted even over a long distance.

In the RF tag which is one of the semiconductor devices of the present invention, the integrated circuit 502 is formed using a single-crystal semiconductor film which is bonded to a substrate having an insulating surface or an insulating substrate, so that not only an increase in processing speed but also reduction in power consumption can be achieved. Further, a large-sized base substrate can be processed and reduction in cost can be achieved, so that cost per RF tag can be reduced.

This embodiment can be implemented in combination with any of the above-described embodiment modes or embodiments as appropriate.

Next, a structure of a CPU (central processing unit) which is one of the semiconductor devices of the present invention will be described.

Figure 16B:
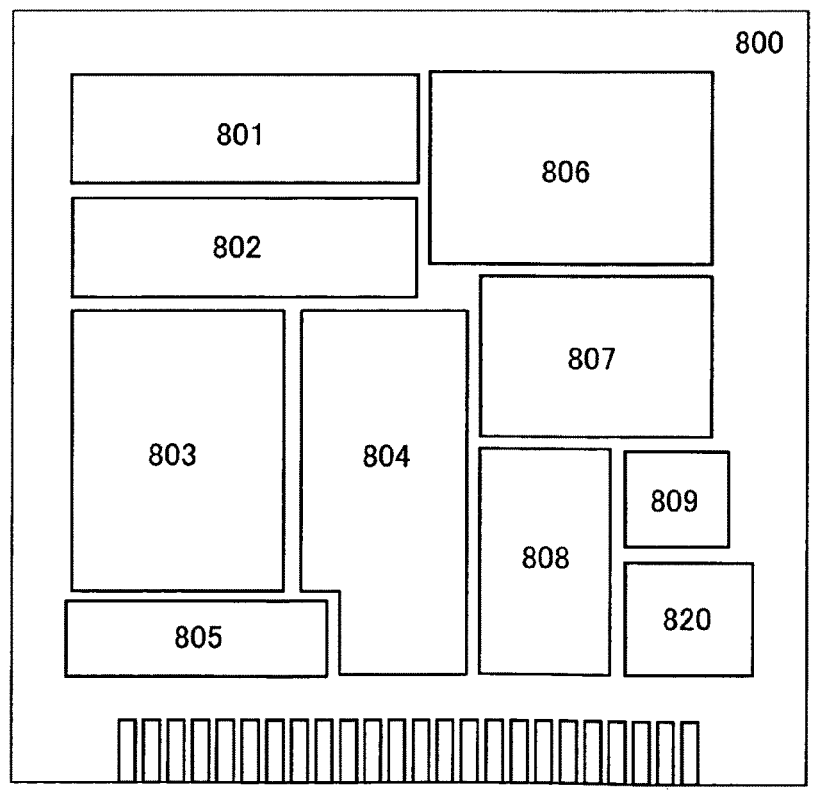

FIG. 16B is a block diagram illustrating a structure of the CPU of this embodiment. The CPU illustrated in FIG. 16B mainly includes an arithmetic logic unit (ALU) 801, an ALU controller 802, an instruction decoder 803, an interrupt controller 804, a timing controller 805, a register 806, a register controller 807, a bus interface (Bus I/F) 808, a memory 809, and a memory interface 820 over a substrate 800. The memory 809 and the memory interface 820 may be provided over another chip. Naturally, the CPU illustrated in FIG. 16B is only an example with a simplified configuration, and an actual CPU may have various configurations depending on the uses.

An instruction input to the CPU through the bus interface 808 is decoded in the instruction decoder 803, and then input to the ALU controller 802, the interrupt controller 804, the register controller 807, and the timing controller 805. The ALU controller 802, the interrupt controller 804, the register controller 807, and the timing controller 805 conduct various controls based on the decoded instruction. Specifically, the ALU controller 802 generates signals for controlling the operation of the ALU 801. While the CPU is executing a program, the interrupt controller 804 judges an interrupt request from an external input/output device or a peripheral circuit based on its priority or a mask state, and processes the request. The register controller 807 generates an address of the register 806, and reads/writes data from/to the register 806 in accordance with the state of the CPU.

The timing controller 805 generates signals for controlling timing of operation of the ALU 801, the ALU controller 802, the instruction decoder 803, the interrupt controller 804, and the register controller 807. For example, the timing controller 805 is provided with an internal clock generator for generating an internal clock signal based on a reference clock signal, and supplies an internal clock signal to the above-mentioned circuits.

In the CPU which is one of the semiconductor devices of the present invention, the integrated circuit is formed using a single-crystal semiconductor film which is bonded to a substrate having an insulating surface or an insulating substrate, so that not only an increase in processing speed but also reduction in power consumption can be achieved. Further, a large-sized base substrate can be processed and reduction in cost can be achieved, so that cost per CPU can be reduced.

This embodiment can be implemented in combination with any of the above-described embodiment modes or embodiments as appropriate.

Embodiment 5

In this embodiment, a structure of an active matrix semiconductor display device is described, which is one kind of the semiconductor devices manufactured by the present invention.

An active matrix light-emitting device includes pixels each provided with a light-emitting element corresponding to a display element. Since a light-emitting element emits light by itself, it is advantageous in that the visibility is high, a backlight necessary for a liquid crystal display device is not required, which is suitable for thinning, and moreover the viewing angle is not restricted. Although a light-emitting device using an organic light-emitting diode (OLED) as one of light-emitting elements is described in this embodiment, the semiconductor display device manufactured by the present invention may be a light-emitting device using any other light-emitting element.

An OLED includes an anode layer, a cathode layer, and a layer (hereinafter referred to as an electroluminescent layer) containing a material from which luminescence (electroluminescence) is obtained by applying an electric field. As electroluminescence, there are luminescence (fluorescence) at the time of returning from a singlet-excited state to a ground state and luminescence (phosphorescence) at the time of returning from a triplet-excited state to a ground state. A light-emitting device manufactured by the present invention may use one or both of fluorescence and phosphorescence.

Figure 17A:
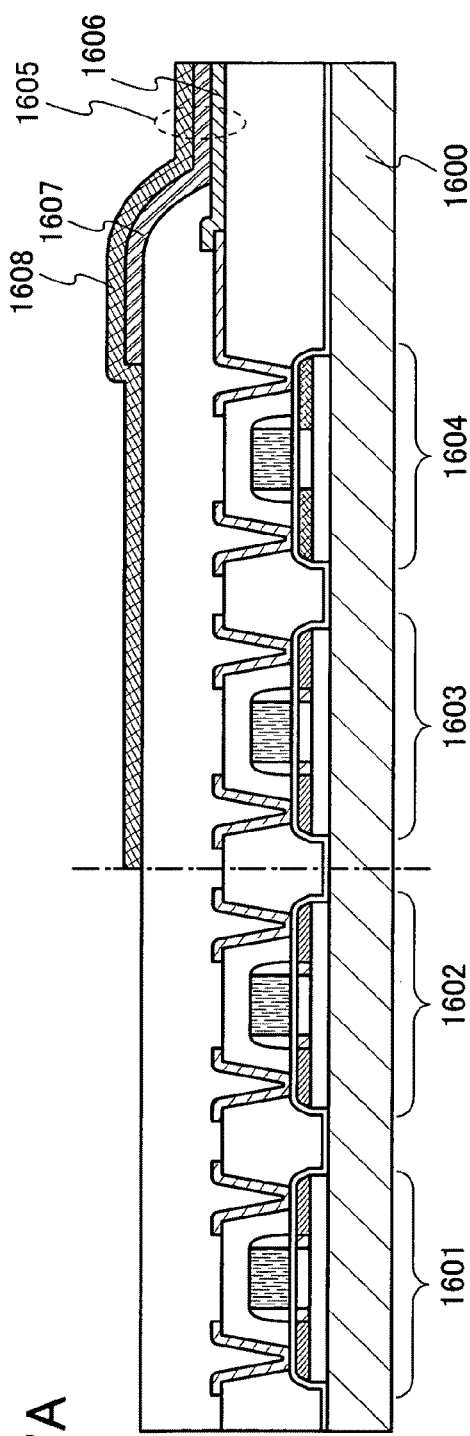
FIGS. 17A and 17B each illustrate a structure of a semiconductor device formed by a manufacturing method of the present invention.

FIG. 17A is a cross-sectional view of a light-emitting device of this embodiment. In the light-emitting device illustrated in FIG. 17A, a transistor 1601 and a transistor 1602 which are used for a driver circuit, and a driving transistor 1604 and a switching transistor 1603 which are used for a pixel, are formed over an element substrate 1600. The light-emitting device illustrated in FIG. 17A also includes a light-emitting element 1605 in a pixel over the element substrate 1600.

The light-emitting element 1605 includes a pixel electrode 1606, an electroluminescent layer 1607, and a counter electrode 1608. One of the pixel electrode 1606 and the counter electrode 1608 is an anode, and the other is a cathode.

The anode can be formed of a light-transmitting conductive oxide such as indium tin oxide containing silicon oxide (ITSO), indium tin oxide (ITO), zinc oxide (ZnO), indium zinc oxide (IZO), or gallium-doped zinc oxide (GZO). As an alternative to the light-transmitting conductive oxide, the anode can be formed, for example, as a single-layer film including one or more of titanium nitride, zirconium nitride, Ti, W, Ni, Pt, Cr, Ag, Al, and the like, as a stack of a titanium nitride film and a film containing aluminum as its main component, as a three-layer film of a titanium nitride film, a film containing aluminum as its main component, and a titanium nitride film, or the like. When the anode is formed of a material other than the light-transmitting conductive oxide and light is extracted from the anode side, the anode is formed to have a thickness such that light transmits therethrough (preferably about 5 nm to 30 nm).

The anode can also be formed of a conductive composition including a conductive macromolecule (also referred to as a conductive polymer). The conductive composition preferably has a sheet resistance of less than or equal to 10000 Ω/square and a light transmittance of greater than or equal to 70% at a wavelength of 550 nm when the conductive composition is formed into a conductive film serving as an anode. Moreover, the conductive macromolecule included in the conductive composition preferably has a resistivity of less than or equal to 0.1 Ω·cm.

The conductive macromolecule may be a so-called π-electron conjugated conductive macromolecule. For example, polyaniline and/or a derivative thereof, polypyrrole and/or a derivative thereof, polythiophene and/or a derivative thereof, and a copolymer of plural kinds of those materials can be given as the π-electron conjugated conductive macromolecule.

As specific examples of the conjugated conductive macromolecule, the following can be given: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly (3-ethoxythiophene), poly(3-octoxythiophene), poly(3-carboxylthiophene), poly(3-methyl-4-carboxylthiophene), poly (3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The aforementioned conductive macromolecule may be used alone as the conducive composition for the anode. Alternatively, in order to adjust the film characteristics such as the uniformity of the film thickness of the conductive composition and the film strength thereof, an organic resin may be added to the aforementioned conductive macromolecule.

As for the organic resin, a thermosetting resin, a thermoplastic resin, or a photocurable resin may be used as long as the resin is compatible to a conductive macromolecule or the resin can be mixed and dispersed into a conductive macromolecule. For example, the following can be used: a polyester-based resin such as polyethylene terephthalate, polybutylene terephthalate, or polyethylene naphthalate; a polyimide-based resin such as polyimide or polyamide imide; a polyamide resin such as polyamide 6, polyamide 6, 6, polyamide 12, or polyamide 11; a fluorine resin such as poly (vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of these resins.

Further, in order to adjust the electrical conductivity of the conductive composition, the conductive composition may be doped with an acceptor dopant or a donor dopant to change the oxidation-reduction potential of a conjugated electron in the conjugated conductive macromolecule.

As the acceptor dopant, a halogen compound, Lewis acid, proton acid, an organic cyano compound, an organometallic compound, or the like can be used. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid can be given as well as organic acid such as organic carboxylic acid and organic sulfonic acid. As the organic carboxylic acid and the organic sulfonic acid, a carboxylic acid compound and a sulfonic acid compound can be used, respectively. As the organic cyano compound, the following compound having two or more cyano groups in a conjugated bonding can be used: tetracyanoethylene, tetracyanoethylene oxide, tetracyanobenzene, tetracyanoquinodimethane, tetracyanoazanaphthalene, and the like.

As the donor dopant, an alkali metal, an alkaline-earth metal, a tertiary amine compound, and the like can be given.

A conductive composition may be dissolved in water or an organic solvent (e.g., an alcohol-based solvent, a ketone-based solvent, an ester-based solvent, a hydrocarbon-based solvent, or an aromatic-based solvent), whereby a thin film which serves as the anode can be formed by a wet process.

There is no particular limitation on the solvent in which the conductive composition is dissolved as long as the aforementioned conductive macromolecule and the macromolecular resin compound such as an organic resin are dissolved. For example, the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methyletylketone, methylisobutylketone, toluene, and the like.

After being dissolved in the solvent as described above, the conductive composition can be deposited by a wet process such as a coating method, a droplet discharging method (also referred to as an inkjet method), or a printing method. The solvent may be dried by heat treatment or may be dried under reduced pressure. When the organic resin is a thermosetting resin, further heat treatment may be performed. When the organic resin is a photocurable resin, light irradiation treatment may be performed.

The cathode can be generally formed by using a metal, an alloy, an electrically conductive compound, or a mixture thereof, each of which has a low work function. Specifically, it is possible to use a rare-earth metal such as Yb or Er as well as an alkali metal such as Li or Cs, an alkaline-earth metal such as Mg, Ca, or Sr, or an alloy containing these (Mg:Ag, Al:Li, or the like). When a layer containing a material having a high electron-injecting property is formed in contact with the cathode, a typical conductive film of aluminum, a light-transmitting conductive oxide, or the like can be used.

The electroluminescent layer 1607 may be formed as a single layer or a stack of plural layers, each layer of which may contain an inorganic material as well as the organic material. The luminescence of the electroluminescent layer 1607 includes luminescence (fluorescence) at the time of returning from a singlet-excited state to a ground state and luminescence (phosphorescence) at the time of returning from a triplet-excited state to a ground state. When the electroluminescent layer 1607 is formed to have a plurality of layers and the pixel electrode 1606 is the cathode, the electroluminescent layer 1607 is formed by stacking an electron-injecting layer, an electron-transporting layer, a light-emitting layer, a hole-transporting layer, and a hole-injecting layer in this order over the pixel electrode 1606. When the pixel electrode 1606 corresponds to the anode, the electroluminescent layer 1607 is formed by stacking a hole-injecting layer, a hole-transporting layer, a light-emitting layer, an electron-transporting layer, and an electron-injecting layer in this order.

The electroluminescent layer 1607 can be formed by a droplet discharging method using any of a macromolecular organic compound, an intermolecular organic compound (which does not have a subliming property but has a molecular chain length of less than or equal to 10 μm), a low molecular organic compound, and an inorganic compound. In the case of using an intermolecular organic compound, a low molecular organic compound, or an inorganic compound, the electroluminescent layer 1607 may be formed by a vapor deposition method.

The switching transistor 1603 and the driving transistor 1604 may each have a multigate structure such as a double gate structure or a triple gate structure instead of a single gate structure.

Figure 17B:
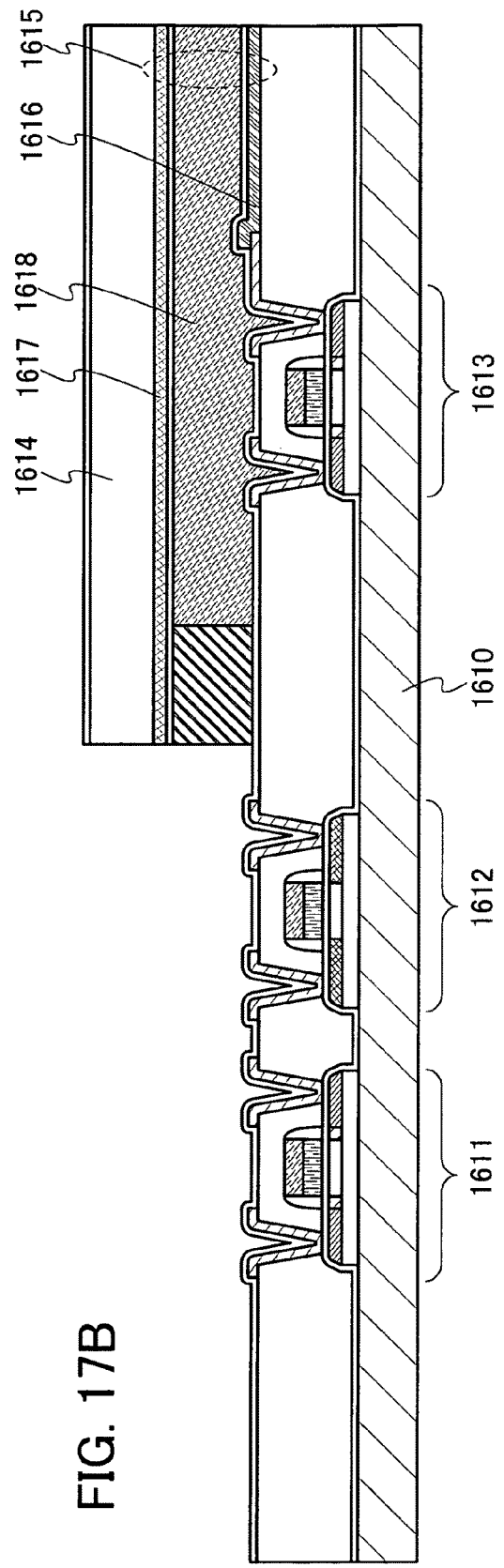

FIG. 17B is a cross-sectional view of a liquid crystal display device of this embodiment. The liquid crystal display device illustrated in FIG. 17B includes over an element substrate 1610 a transistor 1611 and a transistor 1612 which are used for a driver circuit, and a transistor 1613 which is used as a switching element in a pixel. The liquid crystal display device illustrated in FIG. 17B further includes a liquid crystal cell 1615 between the element substrate 1610 and a counter substrate 1614.

The liquid crystal cell 1615 includes a pixel electrode 1616 formed over the element substrate 1610, a counter electrode 1617 formed on the counter substrate 1614, and a liquid crystal 1618 provided between the pixel electrode 1616 and the counter electrode 1617. The pixel electrode 1616 can be formed of, for example, indium tin oxide containing silicon oxide (ITSO), indium tin oxide (ITO), zinc oxide (ZnO), indium zinc oxide (IZO), or gallium-doped zinc oxide (GZO).

This embodiment can be implemented in combination with any of the aforementioned embodiment modes and embodiments as appropriate.

Embodiment 6

In this embodiment, an overall structure of a semiconductor display device manufactured by the present invention is described. FIG. 18 is a block diagram illustrating an example of a semiconductor display device manufactured by the present invention.

The semiconductor display device illustrated in FIG. 18 includes a pixel portion 400 having a plurality of pixels, a scanning line driver circuit 410 which selects pixels for each line, and a signal line driver circuit 420 which controls the input of a video signal to the pixels of a selected line.

The signal line driver circuit 420 of FIG. 18 includes a shift register 421, a first latch 422, a second latch 423, and a D/A (digital to analog) converter circuit 424. A clock signal S-CLK and a start pulse signal S-SP are input to the shift register 421. In accordance with the clock signal S-CLK and the start pulse signal S-SP, the shift register 421 generates a timing signal of which pulse is sequentially shifted, and outputs the timing signal to the first latch 422. The order of pulses of the timing signal may be switched in accordance with a scanning direction switching signal.

Upon the input of the timing signal to the first latch 422, video signals are sequentially written into the first latch 422 to be held in accordance with pulses of the timing signal. The video signals may be sequentially written into a plurality of memory circuits in the first latch 422; alternatively, so-called division driving may be performed, in which the memory circuits in the first latch 422 are divided into some groups and the video signals are input to each group in parallel. Note that the number of groups at this time is called a division number. For example, in a case where memory circuits in a latch is divided into four groups, division driving can be performed with four divisions.

The time until video signal writing into all of the memory circuits in the first latch 422 is completed is called a line period. In practice, the line period may include a horizontal retrace line period.

When one line period is completed, the video signals held in the first latch 422 are written into the second latch 423 all at once to be held in accordance with a pulse of a latch signal S-LS which is input to the second latch 423. The next video signals are sequentially written into the first latch 422 which has finished sending the video signals to the second latch 423, in accordance with timing signals from the shift register 421 again. During this second round of the one line period, the video signals written into and held in the second latch 423 are input to the D/A converter circuit 424.

The D/A converter circuit 424 converts the input digital video signals into analog video signals, which are then input to each pixel in the pixel portion 400 through signal lines.

Note that in the signal line driver circuit 420, another circuit which can output signals, pulses of which are sequentially shifted, may be used instead of the shift register 421.

Although the pixel portion 400 is directly connected to the next stage of the D/A converter circuit 424 in FIG. 18, the present invention is not limited to this structure. A circuit which processes the video signal output from the D/A converter circuit 424 can be provided in the previous stage of the pixel portion 400. Examples of the circuit for processing signals include a buffer which can shape a waveform, and the like.

Next, an operation of the scanning line driver circuit 410 is explained. In the semiconductor display device manufactured by the present invention, each pixel in the pixel portion 400 is provided with a plurality of scanning lines. The scanning line driver circuit 410 generates a selection signal and inputs the selection signal to each of the scanning lines, thereby selecting pixels for each line. When the pixels are selected by the selection signal, transistors of which gates are connected to one scanning line are turned on; thus, the video signals are input to the pixels.

Since the distance between the semiconductor films can be shortened in the present invention, all of the pixel portion 400, the scanning line driver circuit 410, and the signal line driver circuit 420 can be formed over the same base substrate.

This embodiment can be implemented in combination with any of the aforementioned embodiment modes and embodiments as appropriate.

Embodiment 7

Figure 19A:
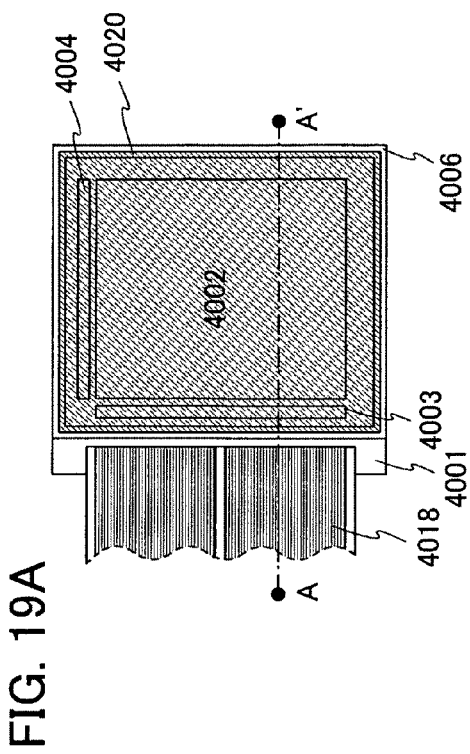
FIGS. 19A and 19B each illustrate a structure of a semiconductor device formed by a manufacturing method of the present invention.
Figure 19B:
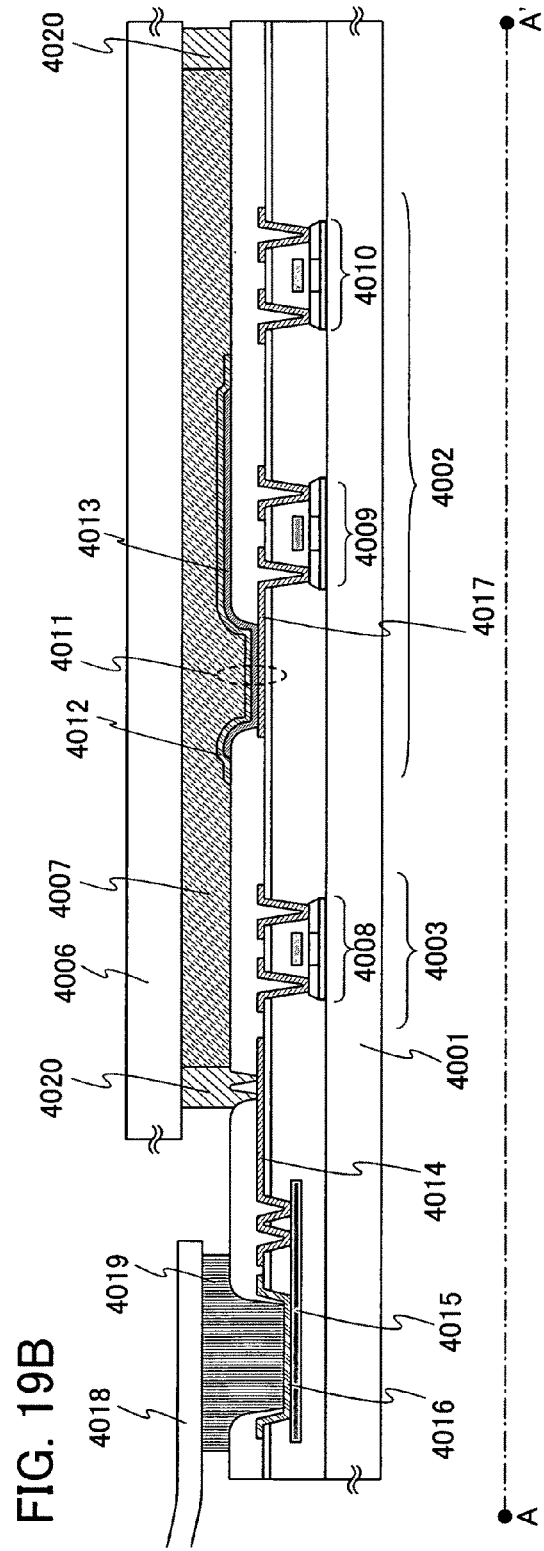

In this embodiment, an external appearance of a semiconductor display device manufactured by the present invention is described with reference to FIGS. 19A and 19B. FIG. 19A is a top view of a panel in which transistors and light-emitting elements formed over a base substrate are sealed by a sealant between the base substrate and a sealing substrate. FIG. 19B corresponds to a cross-sectional view along a line A-A' of FIG. 19A.

A sealant 4020 is provided so as to surround a pixel portion 4002, a signal line driver circuit 4003, and a scanning line driver circuit 4004 which are formed over a base substrate 4001. A sealing substrate 4006 is provided over the pixel portion 4002, the signal line driver circuit 4003, and the scanning line driver circuit 4004. Accordingly, a filler 4007 as well as the pixel portion 4002, the signal line driver circuit 4003, and the scanning line driver circuit 4004 are sealed by the sealant 4020 between the base substrate 4001 and the sealing substrate 4006.

Each of the pixel portion 4002, the signal line driver circuit 4003, and the scanning line driver circuit 4004 formed over the base substrate 4001 has a plurality of transistors. FIG. 19B illustrates, as an example, a transistor 4008 in the signal line driver circuit 4003, and a driving transistor 4009 and a switching transistor 4010 in the pixel portion 4002.

Part of a wiring 4017 connected to a source region or a drain region of the driving transistor 4009 is used as a pixel electrode of a light-emitting element 4011. The light-emitting element 4011 includes a counter electrode 4012 and an electroluminescent layer 4013 in addition to the pixel electrode. The structure of the light-emitting element 4011 is not limited to that shown in this embodiment. The structure of the light-emitting element 4011 can be changed as appropriate in accordance with a direction of light extracted from the light-emitting element 4011, the polarity of the driving transistor 4009, and the like.

A variety of signals and voltages are supplied to the signal line driver circuit 4003, the scanning line driver circuit 4004, or the pixel portion 4002 from a connection terminal 4016 through lead wirings 4014 and 4015, although not illustrated in the cross-sectional view of FIG. 19B.

In this embodiment, the connection terminal 4016 is formed using the same conductive film as the counter electrode 4012 included in the light-emitting element 4011. The lead wiring 4014 is formed using the same conductive film as the wiring 4017. The lead wiring 4015 is formed using the same conductive film as gate electrodes of the driving transistor 4009, the switching transistor 4010, and the transistor 4008.

The connection terminal 4016 is electrically connected to a terminal of an FPC 4018 via an anisotropic conductive film 4019.

The sealing substrate 4006 may be formed of glass, metal (typically, stainless steel), ceramics, plastics, or the like. However, the sealing substrate 4006 which is located on a side from which light of the light-emitting element 4011 is extracted needs to have a light-transmitting property. Thus, a light-transmitting material such as a glass plate, a plastic plate, a polyester film, or an acrylic film is desirably used for the sealing substrate 4006.

The filler 4007 may be formed of an ultraviolet curable resin or a thermosetting resin as well as inert gas such as nitrogen or argon. This embodiment shows an example in which nitrogen is used as the filler 4007.

This embodiment can be implemented in combination with any of the aforementioned embodiment modes and embodiments as appropriate.

Embodiment 8

According to the present invention, semiconductor display devices that are larger in screen size can be manufactured at low cost. Therefore, the semiconductor display device manufactured by the present invention is preferably applied to display devices, laptop personal computers, or image reproducing devices provided with recording media (typically, a device which reproduces a recording medium such as a DVD (digital versatile disc) and has a display for displaying the reproduced image). Moreover, the semiconductor device manufactured by the present invention can be applied to other electronic appliances such as cellular phones, portable game machines, e-book readers, cameras such as video cameras or digital still cameras, goggle type displays (head mount displays), navigation systems, or sound reproducing devices (such as car audio systems and audio systems). Specific examples of these electronic appliances are illustrated in FIGS. 20A to 20C.

Figure 20A:
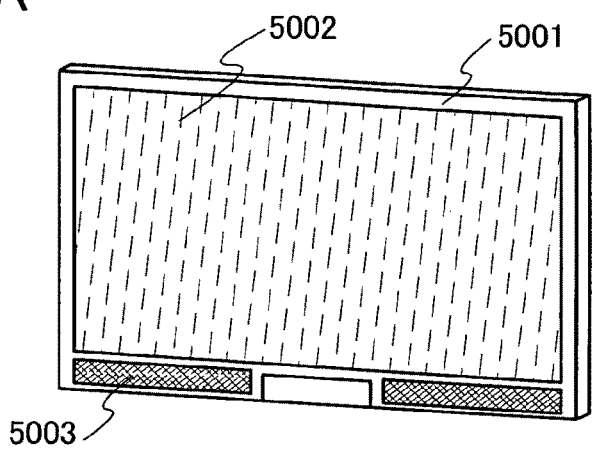
FIGS. 20A to 20C each illustrate an electronic device using a semiconductor device formed by a manufacturing method of the present invention.

FIG. 20A illustrates a display device including a housing 5001, a display portion 5002, a speaker portion 5003, and the like. The semiconductor display device manufactured by the present invention can be used for the display portion 5002. Note that the display device includes all of information display devices for personal computers, TV receivers, advertisement displays, and the like. Alternatively, the semiconductor device manufactured by the present invention may be used for a signal processing circuit.

Figure 20B:
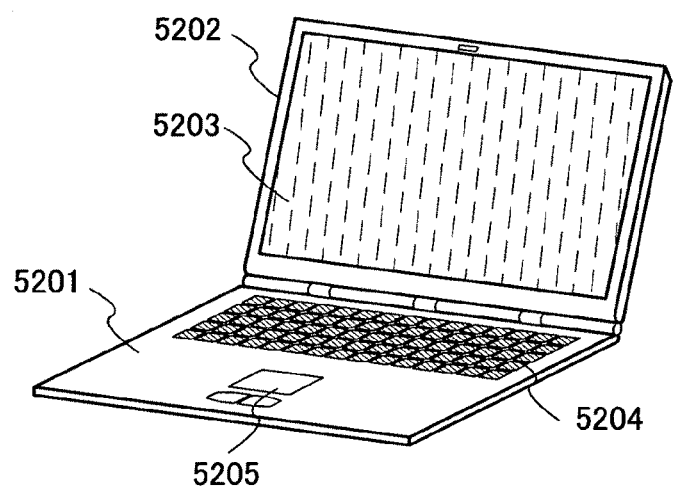

FIG. 20B illustrates a laptop personal computer including a main body 5201, a housing 5202, a display portion 5203, a keyboard 5204, a pointing device 5205, and the like. The semiconductor display device manufactured by the present invention can be used for the display portion 5203. Alternatively, the semiconductor device manufactured by the present invention may be used for a signal processing circuit.

Figure 20C:
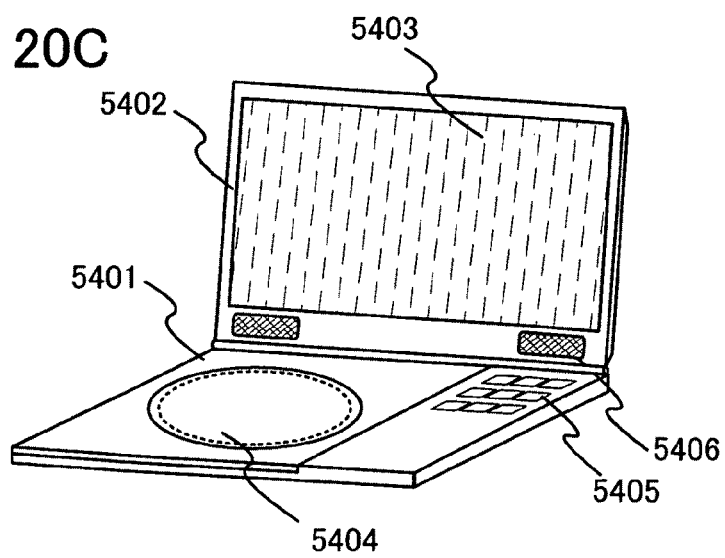

FIG. 20C illustrates a mobile image reproducing device provided with a recording medium (specifically a DVD player), which includes a main body 5401, a housing 5402, a display portion 5403, a recording medium (DVD or the like) reading portion 5404, an operation key 5405, a speaker portion 5406, and the like. The image reproducing device provided with a recording medium includes a home-use game console. The semiconductor display device manufactured by the present invention can be used for the display portion 5403. Alternatively, the semiconductor device manufactured by the present invention may be used for a signal processing circuit.

As described above, the application range of the present invention is so wide that the present invention can be applied to electronic appliances of all fields.

This embodiment can be implemented in combination with any of the aforementioned embodiment modes and embodiments as appropriate.

This application is based on Japanese Patent Application serial no. 2007-212679 filed with Japan Patent Office on Aug. 17, 2007, the entire contents of which are hereby incorporated by reference.

What is claimed is:

1. A manufacturing method of a semiconductor device, comprising the steps of:
    separating a first bond substrate having a plurality of first projections at the plurality of first projections to form a plurality of first semiconductor films using a first vacuum chuck;
    separating a second bond substrate having a plurality of second projections at the plurality of second projections to form a plurality of second semiconductor films having a crystal plane orientation different from that of the plurality of first semiconductor films using a second vacuum chuck;
    bonding the plurality of first semiconductor films to a base substrate; and
    bonding the plurality of second semiconductor films to the base substrate.

2. The manufacturing method of a semiconductor device according to claim 1,
    wherein heat treatment is performed on the first bond substrate to separate the first bond substrate at a first defect layer.

3. The manufacturing method of a semiconductor device according to claim 1,
    wherein heat treatment is performed on the second bond substrate to separate the second bond substrate at a second defect layer.

4. The manufacturing method of a semiconductor device according to claim 1,
    wherein the plurality of first semiconductor films is bonded to the base substrate so that surfaces which are exposed by the separation face the base substrate.

5. The manufacturing method of a semiconductor device according to claim 1,
    wherein the plurality of first semiconductor films is bonded to the base substrate so that surfaces which are opposite to surfaces exposed by the separation face the base substrate.

6. A manufacturing method of a semiconductor device, comprising the steps of:
    selectively irradiating a first bond substrate with laser light to form a first defect layer in the first bond substrate;
    separating the first bond substrate at the first defect layer to form a plurality of first semiconductor films;
    selectively irradiating a second bond substrate with the laser light to form a second defect layer in the second bond substrate;
    separating the second bond substrate at the second defect layer to form a plurality of second semiconductor films having a crystal plane orientation different from that of the plurality of first semiconductor films;
    bonding the plurality of first semiconductor films to a base substrate; and
    bonding the plurality of second semiconductor films to the base substrate,
    wherein the laser light has such a high energy density as to generate multiphoton absorption in the first bond substrate and the second bond substrate with a pulse width less than or equal to a nanosecond.

7. The manufacturing method of a semiconductor device according to claim 6,
    wherein heat treatment is performed on the first bond substrate to separate the first bond substrate at the first defect layer.

8. The manufacturing method of a semiconductor device according to claim 6,
    wherein heat treatment is performed on the second bond substrate to separate the second bond substrate at the second defect layer.

9. The manufacturing method of a semiconductor device according to claim 6,
    wherein the plurality of first semiconductor films is bonded to the base substrate so that surfaces which are exposed by the separation face the base substrate.

10. The manufacturing method of a semiconductor device according to claim 6,
    wherein the plurality of first semiconductor films is bonded to the base substrate so that surfaces which are opposite to surfaces exposed by the separation face the base substrate.

11. A manufacturing method of a semiconductor device, comprising the steps of:
    forming a first defect layer in a first bond substrate by first doping;
    partially etching the first bond substrate to form a plurality of first projections having the first defect layer;
    performing heat treatment on the first bond substrate and separating the first bond substrate at the first defect layer to form a plurality of first semiconductor films using a first vacuum chuck;
    forming a second defect layer in a second bond substrate by second doping;
    partially etching the second bond substrate to form a plurality of second projections having the second defect layer;
    performing heat treatment on the second bond substrate and separating the second bond substrate at the second defect layer to form a plurality of second semiconductor films having a crystal plane orientation different from that of the plurality of first semiconductor films using a second vacuum chuck;
bonding the plurality of first semiconductor films to a base substrate; and
bonding the plurality of second semiconductor films to the base substrate.

12. The manufacturing method of a semiconductor device according to claim 11,
wherein the plurality of first semiconductor films is bonded to the base substrate so that surfaces which are exposed by the separation face the base substrate.

13. The manufacturing method of a semiconductor device according to claim 11,
wherein the plurality of first semiconductor films is bonded to the base substrate so that surfaces which are opposite to surfaces exposed by the separation face the base substrate.

14. A manufacturing method of a semiconductor device, comprising the steps of:
forming a first defect layer in a first bond substrate by first doping;
selectively forming a second defect layer in the first bond substrate by second doping;
performing heat treatment on the first bond substrate and separating the first bond substrate at the first defect layer and the second defect layer to form a plurality of first semiconductor films;
forming a third defect layer in a second bond substrate by third doping;
selectively forming a fourth defect layer in the second bond substrate by fourth doping;
performing heat treatment on the second bond substrate and separating the second bond substrate at the third defect layer and the fourth defect layer to form a plurality of second semiconductor films having a crystal plane orientation different from that of the plurality of first semiconductor films;
bonding the plurality of first semiconductor films to a base substrate; and
bonding the plurality of second semiconductor films to the base substrate.

15. The manufacturing method of a semiconductor device according to claim 14,
wherein the plurality of first semiconductor films is bonded to the base substrate so that surfaces which are exposed by the separation face the base substrate.

16. The manufacturing method of a semiconductor device according to claim 14,
wherein the plurality of first semiconductor films is bonded to the base substrate so that surfaces which are opposite to surfaces exposed by the separation face the base substrate.

17. A manufacturing method of a semiconductor device, comprising the steps of:
separating a first bond substrate having a plurality of first projections at the plurality of first projections to form a plurality of first semiconductor films;
separating a second bond substrate having a plurality of second projections at the plurality of second projections to form a plurality of second semiconductor films having a crystal plane orientation different from that of the plurality of first semiconductor films;
bonding the plurality of first semiconductor films to a base substrate;
bonding the plurality of second semiconductor films to the base substrate;
etching at least side edges of the plurality of first semiconductor films to form a plurality of third semiconductor films; and
etching at least side edges of the plurality of second semiconductor films to form a plurality of fourth semiconductor films.

18. The manufacturing method of a semiconductor device according to claim 17,
wherein heat treatment is performed on the first bond substrate to separate the first bond substrate at a first defect layer.

19. The manufacturing method of a semiconductor device according to claim 17,
wherein heat treatment is performed on the second bond substrate to separate the second bond substrate at a second defect layer.

20. The manufacturing method of a semiconductor device according to claim 17,
wherein the plurality of first semiconductor films is bonded to the base substrate so that surfaces which are exposed by the separation face the base substrate.

21. The manufacturing method of a semiconductor device according to claim 17,
wherein the plurality of first semiconductor films is bonded to the base substrate so that surfaces which are opposite to surfaces exposed by the separation face the base substrate.

22. A manufacturing method of a semiconductor device, comprising the steps of:
forming a first defect layer in a first bond substrate by first doping;
partially etching the first bond substrate to form a plurality of first projections having the first defect layer;
performing heat treatment on the first bond substrate and separating the first bond substrate at the first defect layer to form a plurality of first semiconductor films;
forming a second defect layer in a second bond substrate by second doping;
partially etching the second bond substrate to form a plurality of second projections having the second defect layer;
performing heat treatment on the second bond substrate and separating the second bond substrate at the second defect layer to form a plurality of second semiconductor films having a crystal plane orientation different from that of the plurality of first semiconductor films;
bonding the plurality of first semiconductor films to a base substrate;
bonding the plurality of second semiconductor films to the base substrate;
etching at least side edges of the plurality of first semiconductor films to form a plurality of third semiconductor films; and
etching at least side edges of the plurality of second semiconductor films to form a plurality of fourth semiconductor films.

23. The manufacturing method of a semiconductor device according to claim 22,
wherein the plurality of first semiconductor films is bonded to the base substrate so that surfaces which are exposed by the separation face the base substrate.

24. The manufacturing method of a semiconductor device according to claim 22,
wherein the plurality of first semiconductor films is bonded to the base substrate so that surfaces which are opposite to surfaces exposed by the separation face the base substrate.

25. A manufacturing method of a semiconductor device, comprising the steps of:
- forming a first defect layer in a first bond substrate by first doping;
- selectively forming a second defect layer in the first bond substrate by second doping;
- performing heat treatment on the first bond substrate and separating the first bond substrate at the first defect layer and the second defect layer to form a plurality of first semiconductor films;
- forming a third defect layer in a second bond substrate by third doping;
- selectively forming a fourth defect layer in the second bond substrate by fourth doping; and
- performing heat treatment on the second bond substrate and separating the second bond substrate at the third defect layer and the fourth defect layer to form a plurality of second semiconductor films having a crystal plane orientation different from that of the plurality of first semiconductor films;
- bonding the plurality of first semiconductor films to a base substrate;
- bonding the plurality of second semiconductor films to the base substrate;
- etching at least side edges of the plurality of first semiconductor films to form a plurality of third semiconductor films; and
- etching at least side edges of the plurality of second semiconductor films to form a plurality of fourth semiconductor films.

26. The manufacturing method of a semiconductor device according to claim 25,
wherein the plurality of first semiconductor films is bonded to the base substrate so that surfaces which are exposed by the separation face the base substrate.

27. The manufacturing method of a semiconductor device according to claim 25,
wherein the plurality of first semiconductor films is bonded to the base substrate so that surfaces which are opposite to surfaces exposed by the separation face the base substrate.

* * * * *